(12) United States Patent
Minamio et al.

(10) Patent No.: US 6,338,984 B2
(45) Date of Patent: Jan. 15, 2002

(54) RESIN-MOLDED SEMICONDUCTOR DEVICE, METHOD FOR MANUFACTURING THE SAME, AND LEADFRAME

(75) Inventors: Masanori Minamio; Kunikazu Takemura, both of Osaka; Yuichiro Yamada, Kyoto; Fumito Ito; Takahiro Matsuo, both of Osaka, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/771,548

(22) Filed: Jan. 30, 2001

Related U.S. Application Data

(62) Division of application No. 09/432,216, filed on Nov. 3, 1999, now Pat. No. 6,208,020.

(30) Foreign Application Priority Data

Feb. 24, 1999 (JP) .............................. 11-046040
Apr. 1, 1999 (JP) .............................. 11-095185

(51) Int. Cl.$^7$ .............................. H01L 23/495
(52) U.S. Cl. .................. 438/123; 438/124; 438/127; 257/666
(58) Field of Search .................. 438/111, 112, 438/123, 127, 124, 126; 257/666, 669, 676, 684, 796, 712, 675, 699

(56) References Cited

U.S. PATENT DOCUMENTS

| 3,825,803 A | 7/1974 | Budde |
| 5,365,106 A | 11/1994 | Watanabe |
| 5,479,050 A | 12/1995 | Pritchard et al. |
| 5,583,371 A | 12/1996 | Hori |
| 5,859,387 A | 1/1999 | Gagnon |
| 6,291,274 B1 * | 9/2001 | Oida et al. .................. 438/123 |

* cited by examiner

Primary Examiner—Olik Chaudhuri
Assistant Examiner—Dilinh Nguyen
(74) Attorney, Agent, or Firm—Eric J. Robinson; Nixon Peabody LLP

(57) ABSTRACT

A resin-molded semiconductor device includes: signal leads; a die pad with a central portion elevated above a peripheral portion thereof; support leads, each including a raised portion higher in level than the other portions; and DB paste for use in die bonding. All of these members are encapsulated within a resin encapsulant. The lower part of each of these signal leads protrudes downward out of the resin encapsulant and functions as an external electrode. Each of the support leads is provided with two bent portions to cushion the deforming force. By forming a half-blanked portion in the die pad, the central portion is elevated above the peripheral portion, thus preventing the semiconductor chip from being hampered by the support leads. Accordingly, the size of the semiconductor chip mounted can be selected from a broader range and the humidity resistance of the device can also be improved.

6 Claims, 15 Drawing Sheets

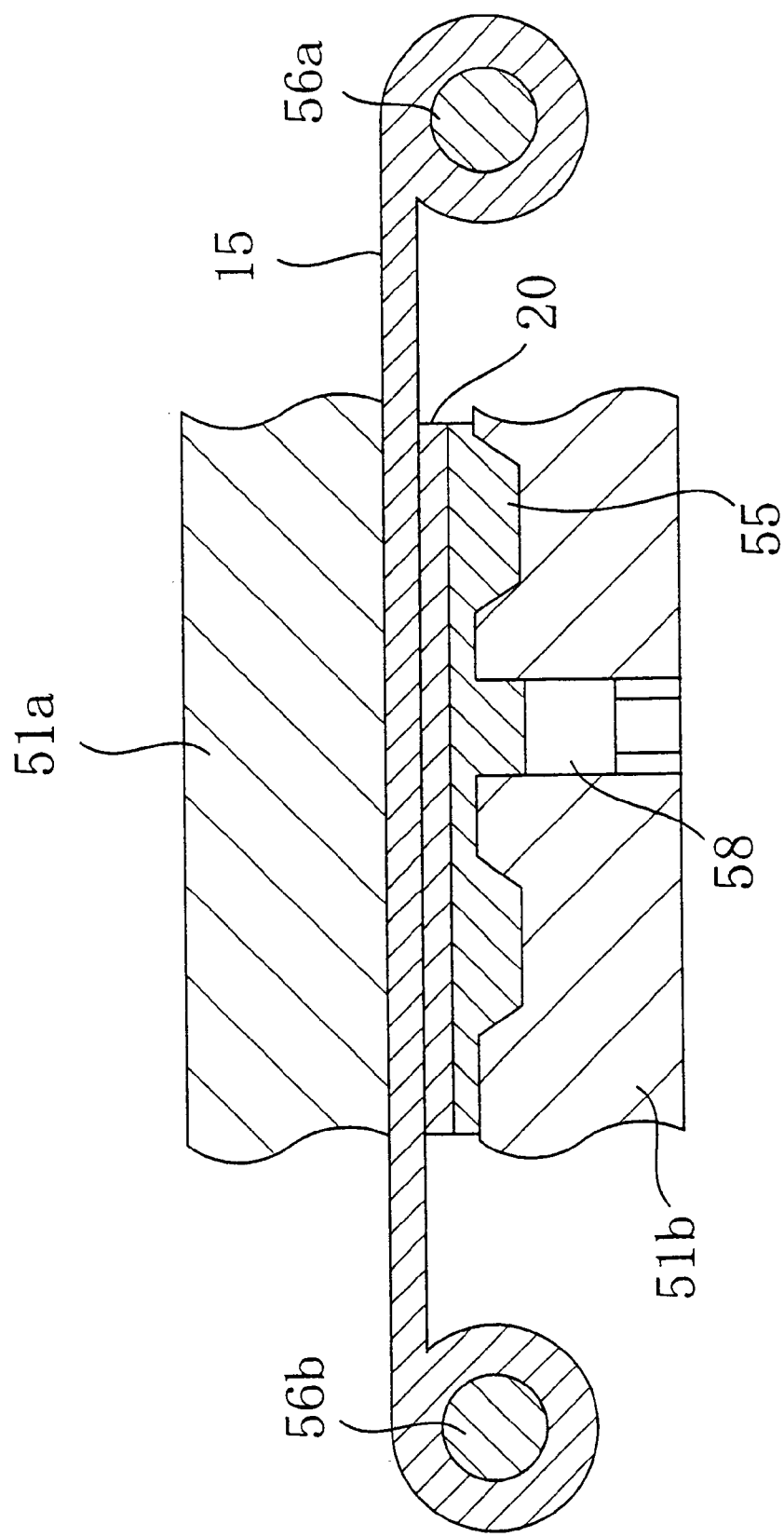

RESIN-MOLDED SEMICONDUCTOR DEVICE, METHOD FOR MANUFACTURING THE SAME, AND LEADFRAME

This application is a division of Ser. No. 09/432,216, filed Nov. 3, 1999, now U.S. Pat. No. 6,208,020.

BACKGROUND OF THE INVENTION

The present invention relates to a resin-molded semiconductor device in which semiconductor chip, leadframe and so on are molded with a resin encapsulant. In particular, the present invention relates to an improved device with the backside of a die pad exposed to radiate heat from a built-in power electronic device more efficiently.

In recent years, to catch up with rapidly advancing downsizing of electronic units, it has become increasingly necessary to assemble semiconductor components for those electronic units at a higher and higher density. Correspondingly, sizes and thicknesses of the semiconductor components such as resin-molded semiconductor devices, in which semiconductor chip, leadframe and so on are molded with a resin encapsulant, have also been noticeably reduced. Examples of resin-molded semiconductor devices accomplishing these objects include a so-called "quad flat nonleaded (QFN)" package. From the QFN package, outer leads, which are usually provided to protrude laterally out of a package, are eliminated. Instead, external electrodes to be electrically connected to a motherboard are provided on the backside of the QFN package.

Particularly when a power electronic device is built in a semiconductor chip, the resin-molded semiconductor device should have its size or thickness reduced while taking its heat radiation properties into account. Thus, a QFN package for a power electronic device (hereinafter, simply referred to as a "power QFN package") has intentionally exposed the backside of a die pad, on which a semiconductor chip is mounted, not covered with a resin encapsulant. Hereinafter, structure and manufacturing method of a conventional power QFN package will be described.

FIG. 18(a) is a perspective view of a conventional power QFN package; FIG. 18(b) is a cross-sectional view thereof taken along the line XVIIIb—XVIIIb in FIG. 18(a); and FIG. 18(c) is a bottom view thereof.

As shown in FIGS. 18(a) through 18(c), the conventional power QFN package includes a leadframe consisting of: signal leads 101; a die pad 102; and support leads 103 for supporting the die pad 102. A semiconductor chip 104 with a built-in power electronic device is bonded on the die pad 102 with an adhesive 108, and electrode pads (not shown) of the chip 104 are electrically connected to the signal leads 101 with metal fine wires 105. And the die pad 102 except for its backside, semiconductor chip 104, signal leads 101, support leads 103 and metal fine wires 105 are molded with a resin encapsulant 106. In this structure, no resin encapsulant 106 exists on the backside of the signal leads 101. In other words, the backside of the signal leads 101 is exposed and the respective lower parts of the signal leads 101, including the exposed back surfaces thereof, are used as external electrodes 101a.

The backside 102a of the die pad 102 is not covered with the resin encapsulant 106 either, but functions as an exposed heat-radiating plate. By bringing this die pad 102 into contact with a heat-radiating portion of a motherboard, a heat quantity, which has been emitted from the power electronic device consuming a lot of power, can be dissipated, thus suppressing a rise in temperature within the package.

According to the conventional technique, when the power QFN package is mounted on a motherboard such as a printed wiring board, solder ball electrodes are attached onto the external electrodes 101a to ensure a standoff height as measured from the backside of the resin encapsulant 106. This is done because the standoff height is required in bonding the external electrodes 101a, i.e., the lower parts of the signal leads 101, to the electrodes of the motherboard. After the standoff height has been ensured by providing these ball electrodes in this manner, the package is mounted on the motherboard.

A power QFN package like this may be manufactured by performing the following process steps, for example. First, a leadframe, including the signal leads 101, die pad 102, support leads 103 and so on, is prepared. It should be noted that the leadframe prepared is often provided with dam bars for preventing the overflow of a resin encapsulant during resin molding. Next, the semiconductor chip 104 is bonded, with the adhesive 108, onto the die pad 102 of the leadframe prepared. This process step is called "die bonding". Then, the semiconductor chip 104, which has been bonded onto the die pad 102, is electrically connected to the signal leads 101 with the metal fine wires 105. This process step is called "wire bonding". As the metal fine wires 105, aluminum (Al) or gold (Au) fine wires may be appropriately used, for example.

Subsequently, the semiconductor chip 104, part of the die pad 102 except for the backside thereof, signal leads 101, support leads 103 and metal fine wires 105 are molded with the resin encapsulant 106 such as an epoxy resin. In this case, the leadframe, on which the semiconductor chip 104 has been bonded, is introduced into a molding die assembly and transfer-molded. In particular, resin molding is performed with the backside of the signal leads 101 in contact with the upper or lower die of the die assembly. Finally, the ends of the signal leads 101, protruding outward from the resin encapsulant 106, are cut off after the resin molding process step. By performing this cutting process step, the end faces of the signal leads 101 cut off are substantially flush with the side faces of the resin encapsulant 106. That is to say, this structure does not include any outer leads, which are ordinarily provided as external terminals. Instead, solder ball electrodes are provided for this structure as alternative external terminals under the external electrodes 101a, which are respective exposed lower parts of the signal leads 101 not covered with the resin encapsulant 106. As the case may be, a solder plating layer is sometimes formed in place of the solder balls.

The conventional power QFN package, however, has the following drawbacks. First, since the lower surfaces of the external electrodes 101a are located in substantially the same plane as the resin encapsulant 106 on the backside of the semiconductor device, no standoff height is ensured as measured from the bottom of the resin encapsulant 106. Thus, the device must be mounted onto a motherboard with the solder ball electrodes interposed therebetween. Accordingly, mounting cannot be carried out efficiently.

In the conventional manufacturing process of a resin-molded semiconductor device, a leadframe, on which a semiconductor chip has been bonded, is introduced into a die assembly. Then, the leadframe with the chip mounted is molded with a resin by pressing the signal leads against the surface of the lower die such that the leads come into close contact with the die. Even so, there occurs a problem that the resin encapsulant reaches the backside of the signal leads to form a resin burr (overflowed resin) on the surface of the external electrodes.

Thus, according to a proposed technique, a seal tape is interposed between the lower surface of the outer rail or the signal leads and the surface of the die assembly and resin molding is carried out with the lower parts of the signal leads forced into the seal tape. In this manner, those lower parts of the signal leads are protruded downward out of the resin encapsulant. In such a case, however, if the outer rail is deformed due to the clamping force applied to the outer rail and to the signal leads neighboring the outer rail, the force causing that deformation might be transmitted to the die pad by way of the support leads. As a result, the die pad might be deformed or displaced. It is imaginable to eliminate the support leads to obviate such inconvenience. Nevertheless, the reliability of the package might be risked because the die pad could not be supported with certainty in such a case.

In view of these respects, part of a support lead is preferably bent to form a raised portion higher in level than the other portions of the support lead. Then, the support lead can function as a sort of spring cushioning the deformation of the die pad. Accordingly, it is probably possible to prevent the die pad from being deformed due to the clamping force applied to the outer rail of the leadframe.

If the support leads are expected to perform a deformation cushioning function by providing those raised portions therefor, however, such a structure lacks in adaptability to chips of various sizes. Specifically, aside from semiconductor chips of relatively small sizes, if semiconductor chips of relatively large sizes are mounted on such a leadframe structure, those chips might be hampered by the raised portions of the signal leads.

SUMMARY OF THE INVENTION

An object of the present invention is providing a resin-molded semiconductor device adaptable to semiconductor chips of widely varying sizes and a method for manufacturing the same.

Another object of the present invention is improving the reliability of a resin-molded semiconductor device by preventing a resin encapsulant from being peeled off a die pad with a lot more certainty.

A leadframe according to the present invention is used for manufacturing a resin-molded semiconductor device. The leadframe includes: an outer rail surrounding an opening, in which a semiconductor chip will be mounted; a die pad provided inside the opening; a plurality of support leads for supporting the die pad; and a plurality of signal leads, which are connected to the outer rail around the periphery of the opening and extend toward the die pad. Each said support lead is provided with a raised intermediate portion higher in level than the other portion thereof. A central portion of the die pad is elevated above a peripheral portion thereof surrounding the central portion to support the semiconductor chip thereon.

In the leadframe according to the present invention, each support lead is provided with a raised portion and can cushion the force causing deformation. Thus, when resin molding is performed using this leadframe and a seal tape Such that a lower part of each signal lead protrudes out of the resin encapsulant, the support leads are not deformed even with the clamping force applied to the outer rail of the leadframe. Accordingly, it is possible to prevent the die pad from being deformed or displaced because of the clamping force. In addition, since the central portion of the die pad is elevated above the peripheral portion thereof, even a semiconductor chip of a relatively large size is not hampered by the support leads. That is to say, the semiconductor chip mounted on the leadframe can be selected from a much broader size range. Moreover, since the semiconductor chip is mounted only on the central portion of the die pad, the resin encapsulant also exists between the peripheral portion of the die pad and the semiconductor chip. As a result, the semiconductor chip can be held by the resin encapsulant more strongly and a resin-molded semiconductor device with improved moisture resistance can be provided.

In one embodiment of the present invention, the central portion of the die pad is preferably elevated above the peripheral portion via a half-blanked portion. In such an embodiment, the central portion can be elevated with substantially no strain applied to the die pad.

In another embodiment of the present invention, the upper surface of the die pad at the central portion is preferably higher in level than the uppermost surface of the support leads at the raised portion. In such an embodiment, hampering between the semiconductor chip mounted and the support leads can be avoided easily and with more certainty.

In still another embodiment, the die pad is preferably partially punched between the central and peripheral portions thereof. In such an embodiment, when resin molding is carried out using this leadframe, the resin encapsulant can be poured down through the punched portions around the central portion. As a result, a resin-molded semiconductor device, in which the central portion of the die pad is in much closer contact with the resin encapsulant, can be provided.

A first exemplary resin-molded semiconductor device according to the present invention includes: a die pad, a central portion of the die pad being elevated above a peripheral portion thereof surrounding the central portion; a semiconductor chip mounted on the central portion of the die pad; a plurality of support leads for supporting the die pad; a plurality of signal leads extending toward the die pad; a plurality of metal fine wires for electrically connecting the semiconductor chip to the signal leads; and a resin encapsulant for encapsulating the semiconductor chip, the die pad, the support leads, the metal fine wires and the signal leads such that the lower and outer side faces of each said signal lead are exposed as an external terminal and that a lower part of the signal lead protrudes downward. Each said support lead extends from the die pad to reach an associated side face of the resin encapsulant and is provided with a raised intermediate portion higher in level than the other portion of the support lead.

The first resin-molded semiconductor device performs the same functions and attains the same effects as those of the inventive leadframe. As a result, the size of a semiconductor chip to be housed in the resin-molded semiconductor device can be selected from a wider range and the moisture resistance of the device can be improved.

In one embodiment of the present invention, the lower surface of the semiconductor chip is preferably higher in level than the uppermost surface of each said support lead.

In another embodiment of the present invention, the raised portion of each said support lead is preferably sloped in such a manner as to reduce its height from a portion closest to the die pad toward the associated side face of the resin encapsulant.

In still another embodiment, the die pad is preferably partially punched between the central and peripheral portions thereof, and a region under the central portion of the die pad is preferably also filled in with the resin encapsulant. In such an embodiment, the central portion of the die pad can be in even closer contact with the resin encapsulant.

In still another embodiment, a closed-loop groove is preferably formed in the lower surface of the die pad at the peripheral portion. In such an embodiment, the resin encapsulant does not overflow onto the lower surface of the die pad at the peripheral portion.

A second exemplary resin-molded semiconductor device according to the present invention includes: a die pad, a central portion of the die pad being elevated above a peripheral portion thereof surrounding the central portion; a semiconductor chip mounted on the central portion of the die pad; a plurality of support leads for supporting the die pad; a plurality of signal leads extending toward the die pad; a plurality of metal fine wires for electrically connecting the semiconductor chip to the signal leads; and a resin encapsulant for encapsulating the semiconductor chip, the die pad, the support leads, the metal fine wires and the signal leads such that the lower and outer side faces of each said signal lead are exposed as an external terminal and that a lower part of the signal lead protrudes downward. Each said support lead extends from the die pad to reach an associated side face of the resin encapsulant and is provided with a raised intermediate portion higher in level than the other portion of the support lead. The semiconductor chip is supported by the raised portions of the support leads.

The second resin-molded semiconductor device also exhibits improved moisture resistance just like the first resin-molded semiconductor device. In addition, the semiconductor chip can be supported more stably by the support leads in the second device.

In one embodiment of the present invention, a closed-loop groove is also preferably formed in the lower surface of the die pad at the peripheral portion.

A third exemplary resin-molded semiconductor device according to the present invention includes: a die pad, a central portion of the die pad being elevated above a peripheral portion thereof surrounding the central portion; a semiconductor chip mounted on the central portion of the die pad; a plurality of support leads for supporting the die pad; a plurality of signal leads extending toward the die pad; a plurality of metal fine wires for electrically connecting the semiconductor chip to the signal leads; and a resin encapsulant for encapsulating the semiconductor chip, the die pad, the support leads, the metal fine wires and the signal leads such that the lower and outer side faces of each said signal lead are exposed as an external terminal and that a lower part of the signal lead protrudes downward. Part of the resin encapsulant is interposed between the upper surface of the die pad at the peripheral portion and the backside of the semiconductor chip. A groove is provided in the upper surface of the die pad at the peripheral portion so as to surround the central portion.

In the resin-molded semiconductor device according to any embodiment of the present invention, a gap exists between the upper surface of the die pad at the peripheral portion surrounding the central portion thereof and the backside of the semiconductor chip. By filling in the gap with the resin encapsulant, the resin encapsulant can be in closer contact with the upper surface of the peripheral portion. If the moisture resistance of the device deteriorates or if a thermal stress is caused in the device, part of the resin encapsulant filling the gap between the peripheral portion of the die pad and the semiconductor chip might peel off the die pad over a wider and wider area. In contrast, the third resin-molded semiconductor device is provided with a groove in the upper surface of the peripheral portion, where peeling of the resin encapsulant possibly happens. Accordingly, even if the resin is peeling off the die pad over an increasingly wide area, that peeled portion can be trapped at the groove. Thus, the reliability of the resin-molded semiconductor device can be maintained by preventing that peeling of the resin off the die pad from expanding.

In one embodiment of the present invention, the central portion is preferably elevated by pressworking and half-blanking the die pad, and preferably has a substantially circular planar shape.

In another embodiment of the present invention, a plurality of the grooves are preferably provided.

In still another embodiment, each said support lead preferably extends from the die pad to reach an associated side face of the resin encapsulant and is preferably provided with a raised intermediate portion higher in level than the other portion of the support lead.

A first exemplary method for manufacturing a resin-molded semiconductor device according to the present invention includes the steps of a) preparing a semiconductor chip and b) preparing a leadframe. The leadframe includes: an outer rail surrounding an opening, in which the semiconductor chip will be mounted; a die pad provided inside the opening, a central portion of the die pad being elevated above a peripheral portion thereof surrounding the central portion; a plurality of support leads for connecting the die pad to the outer rail, each said support lead including a raised intermediate portion higher in level than the other portion thereof; and a plurality of signal leads, which are connected to the outer rail around the periphery of the opening and extend toward the die pad. The method further includes the steps of: c) bonding the semiconductor chip on the central portion of the die pad in the leadframe; d) electrically connecting the semiconductor chip to the signal leads via connection members; and e) molding the semiconductor chip, the die pad, the connection members, the support leads and the signal leads with a resin encapsulant with a seal tape interposed between the backside of the leadframe and a die assembly and with clamping force applied to the leadframe and the seal tape.

According to the first method, the size restrictions of semiconductor chips can be eased, the deformation or displacement of the die pad during resin molding can be suppressed and the lower part of each signal lead can be protruded out of the resin encapsulant.

In one embodiment of the present invention, the clamping force is preferably applied to the outer rail of the leadframe and to the seal tape in the step e). In such an embodiment, the lower part of each signal lead adjacent to the outer rail can have its protrusion height increased.

In another embodiment of the present invention, a closed-loop groove is preferably formed in the lower surface of the die pad at the peripheral portion in the step b). In such an embodiment, it is possible to prevent the resin encapsulant from overflowing so far as to reach the lower surface of the die pad at the peripheral portion.

In still another embodiment, the die pad is preferably partially punched between the central and peripheral portions thereof in the step b). In such an embodiment, the resin encapsulant can be poured down through the punched portions around the central portion of the die pad during the resin molding step e).

A second exemplary method for manufacturing a resin-molded semiconductor device according to the present invention includes the steps of a) preparing a semiconductor chip with electrodes and b) preparing a leadframe. The leadframe includes: an outer rail surrounding an opening, in which the semiconductor chip will be mounted; a die pad provided inside the opening, a central portion of the die pad being elevated above a peripheral portion thereof surrounding the central portion, a groove being provided in the upper surface of the die pad at the peripheral portion; a plurality of support leads for supporting the die pad; and a plurality of signal leads, one end of each said signal lead being connected to the outer rail, while the other end thereof extending toward the die pad. The method further includes the steps of: c) securing the semiconductor chip onto the die pad by bonding the upper surface of the die pad at the central portion to the backside of the semiconductor chip via an adhesive; d) electrically connecting the electrodes of the semiconductor chip mounted on the die pad to the signal leads of the leadframe with metal fine wires; e) molding the semiconductor chip, the die pad, the support leads, the metal fine wires and the signal leads with a resin encapsulant such that the lower and outer side faces of each said signal lead are exposed as an external terminal and that a lower part of the signal lead protrudes downward; and f) partially cutting the signal leads off such that an end face of each said signal lead is substantially flush with an associated side face of the resin encapsulant, and cutting the support leads off to remove the resin-molded semiconductor device from the outer rail of the leadframe.

According to the second method, a highly reliable resin-molded semiconductor device can be obtained by stopping the progress of peeling of the resin off the die pad.

In one embodiment of the present invention, the central portion of the die pad is preferably elevated above the peripheral portion by pressworking and half-blanking the die pad in the step b). In such an embodiment, strain, which might be caused in the die pad when the central portion thereof is elevated above the peripheral portion, can be minimized.

BRIEF DESCRIPTION OF THE DRAWINGS

FIG. 3(a) illustrates the leadframe formed by patterning a copper alloy plate; and FIG. 3(b) illustrates the leadframe wrought by pressworking.

FIG. 11 is a cross-sectional view illustrating a state of the die assembly during resin molding in the manufacturing process according to the first embodiment.

DESCRIPTION OF THE PREFERRED EMBODIMENTS

In the following illustrative embodiments, the present invention will be described as being applied to a power QFN package with a built-in power electronic device as an exemplary resin-molded semiconductor device.

Embodiment 1

Structure of Power QFN Package

Figure 1A:
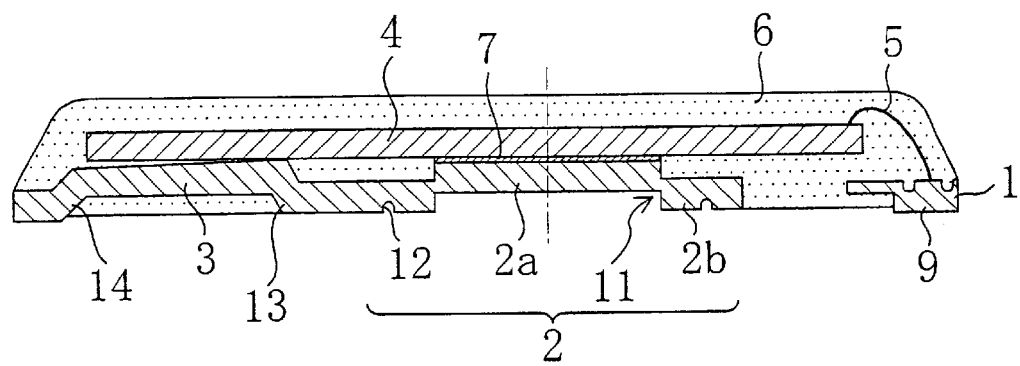
FIG. 1(a) is a cross-sectional view of a power QFN package according to a first embodiment of the present invention taken along the line Ia—Ia.
Figure 1B:
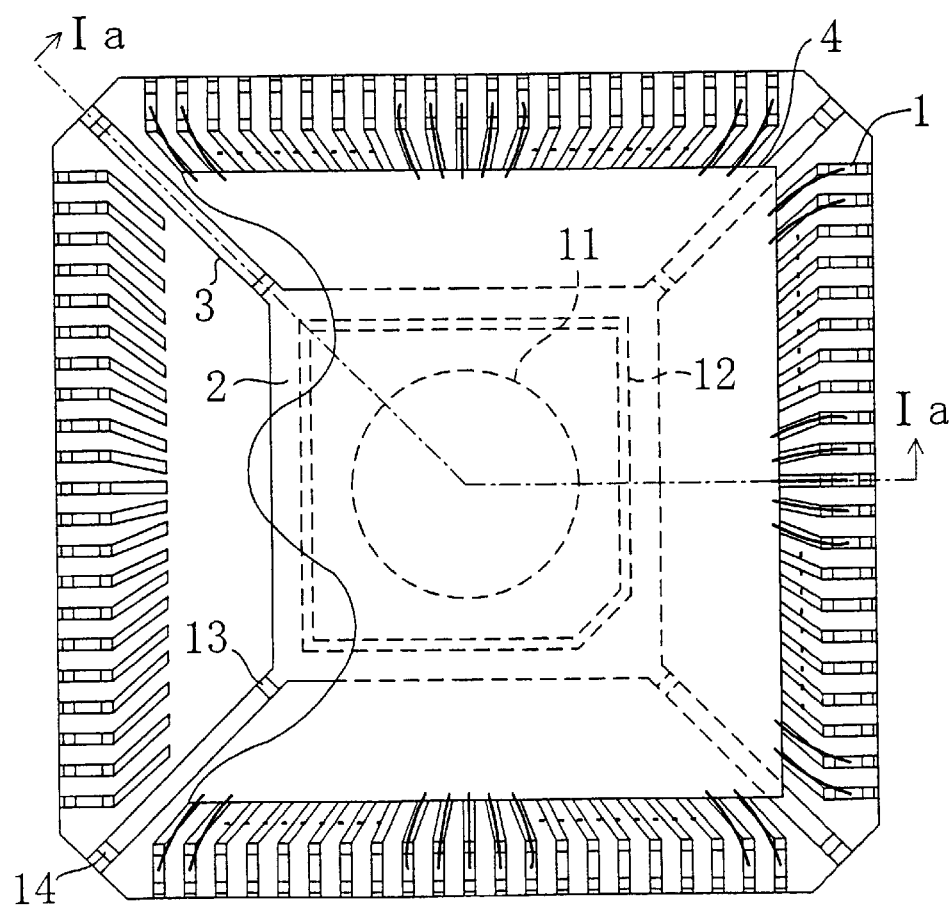
FIG. 1(b) is a plan view of the power QFN package.

FIG. 1(a) is a cross-sectional view taken along the line Ia—Ia in FIG. 1(b), illustrating a power QFN package according to a first embodiment of the present invention on a larger scale. FIG. 1(b) is a plan view of the power QFN package according to the first embodiment. It should be noted that the cross section illustrated in FIG. 1(a) is magnified to a larger scale vertically than horizontally to make the structure easily understandable. Also, in FIG. 1(b), the resin encapsulant 6 is illustrated as being transparent.

Figure 2:
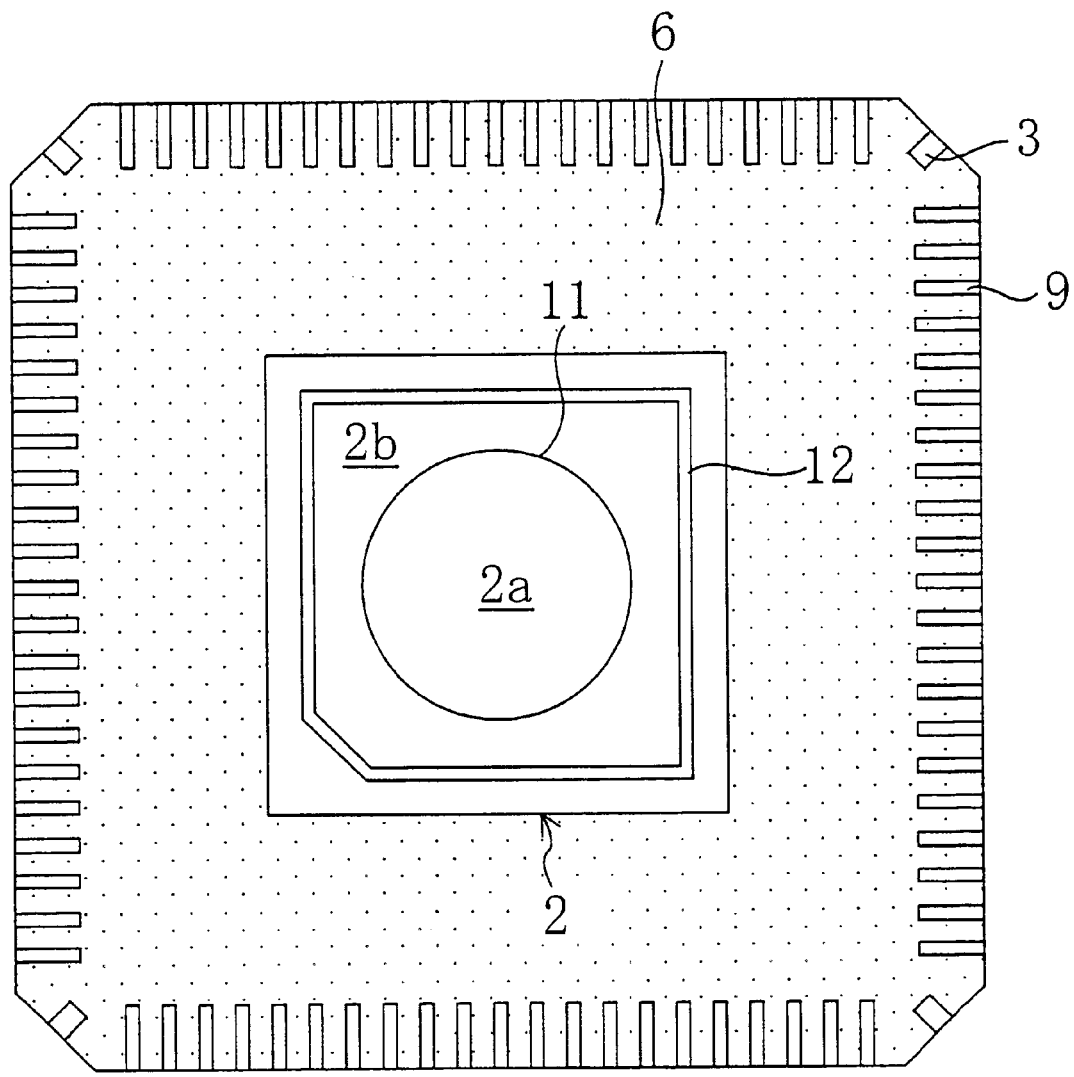
FIG. 2 is a bottom view of the power QFN package according to the first embodiment.

FIG. 2 is a bottom view of the power QFN package according to the first embodiment, in which the resin encapsulant 6 is illustrated as being non-transparent.

As shown in FIGS. 1(a), 1(b) and 2, the power QFN package according to the first embodiment includes the following members separated from the leadframe: signal leads 1 for transmitting electrical signals as well as power supply and ground potentials; a die pad 2 for mounting a semiconductor chip 4 thereon; and support leads 3 for supporting the die pad 2.

According to the first embodiment, a central portion 2a of the die pad 2 is elevated above a peripheral portion 2b thereof via a circular half-blanked portion 11. Also, each of the support leads 3 is bent at two portions 13 and 14 to cushion the force causing deformation. The semiconductor chip 4 is bonded onto the central portion 2a of the die pad 2 via die bonding (DB) paste 7. And electrode pads (not shown) of the semiconductor chip 4 are electrically connected to the signal leads 1 with metal fine wires 5.

The circular half-blanked portion 11 is formed by half-blanking a metal plate for the die pad 2 to a halfway point and is still connected to the metal plate, not completely blanked off the plate. Accordingly, if the circular half-blanked portion 11 is pressed in the direction in which the portion 11 protrudes, then the portion 11 is easily fracturable.

The central portion 2a of the die pad 2 may be elevated above the peripheral portion 2b by half-etching the plate, instead of forming the half-blanked portion 11 out of the plate.

And the signal leads 1, die pad 2, support leads 3, semiconductor chip 4 and metal fine wires 5 are encapsulated within the resin encapsulant 6. However, the respective lower parts of the signal leads 1 and support leads 3 around the outer periphery of the package protrude downward out of the lower surface of the resin encapsulant 6. These lower parts of the signal leads 1 function as external electrodes (or external terminals) 9 to be electrically connected to a motherboard. In addition, virtually no resin burr, which ordinarily sticks out during a resin molding step, exists on the lower surface of each external electrode 9. The external electrodes 9 can be easily formed in such a shape by the manufacturing process described later so as to protrude downward with no resin burr thereon.

On the other hand, the lower surface of the die pad 2 at the peripheral portion 2b is located within substantially the same plane as the lower surface of the resin encapsulant 6, and exposed without being covered with the resin encapsulant 6. That is to say, the lower surface of the die pad 2 at the peripheral portion 2b is located above the lower surfaces of the signal leads 1 and support leads 3 around the outer periphery of the package. Also, each of the support leads 3 is sloped in such a manner as to reduce its height outward. Furthermore, a narrow groove 12 with an approximately square planar shape is formed in the lower surface of the die pad 2 at the peripheral portion 2. Only one corner of the quasi-square groove is chamfered to indicate a No. 1 pin.

Hereinafter, the effects attainable by the functions of the power QFN package according to the first embodiment will be described.

Firstly, no outer leads exist beside the signal leads 1. Instead, the lower part of each of these signal leads 1 functions as the external electrode 9. Accordingly, such a structure contributes to downsizing of a power QFN package without limiting the size of a semiconductor chip mounted. Moreover, since no resin burr exists on the respective lower surfaces of the external electrodes 9, the electrodes of the motherboard can be bonded to these external electrodes 9 with more reliability. Furthermore, the external electrodes 9 are formed to protrude out of the lower surface of the resin encapsulant 6. Thus, a standoff height, which should be ensured in bonding the external electrodes to the counterparts of the motherboard during mounting of the resin-molded semiconductor device onto the motherboard, has already been obtained for the external electrodes 9. Accordingly, the external electrodes 9 may be used as external terminals as they are. In addition, unlike the conventional process, there is no need to attach any solder balls to the external electrodes 9 in mounting the device onto the motherboard. Therefore, this method is advantageous in the number and cost of manufacturing process steps. Moreover, since the narrow groove 12 is provided, the formation of resin burr can be prevented with much more certainty as will be described later.

Furthermore, since the intermediate portion of each of the support leads 3 has such a cross-sectional shape as being raised by the two bent portions 13 and 14, the support lead 3 can cushion the deforming force. Thus, when resin molding is performed using a seal tape such that the lower part of each signal lead 1, i.e., the external electrode 9, protrudes from the resin encapsulant 6, the support leads 3 are not deformed even with clamping force applied to the outer rail of the leadframe. Accordingly, it is possible to prevent the die pad 2 from being deformed or displaced because of the clamping force.

Furthermore, the central portion 2a of the die pad 2 is elevated upward by the half-blanked portion 11. Thus, even if the semiconductor chip 4 is so large as to hang over the bent portions 13 of the support leads 3, the lower surface of the semiconductor chip 4 mounted on the central portion 2a can be located above the respective uppermost surfaces of the support leads 3. Accordingly, the semiconductor chip 4 is not hampered by the raised portions of the support leads 3. In other words, by providing the raised portions for the support leads 3, the deforming force can be cushioned and the size of the semiconductor chip 4 can be selected from a broader range.

Figure 18A:
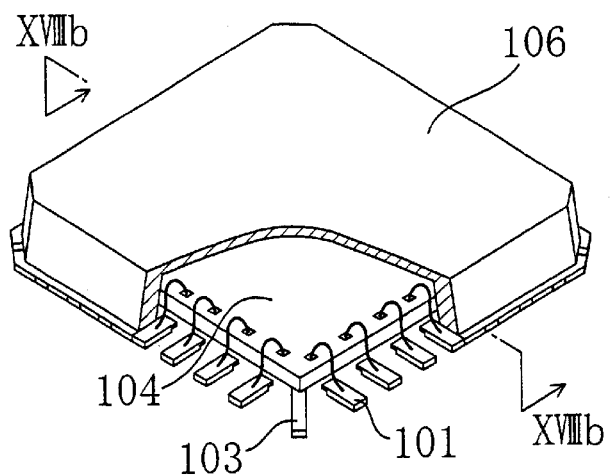
FIG. 18(a) is a perspective view of a conventional power QFN package.
Figure 18B:
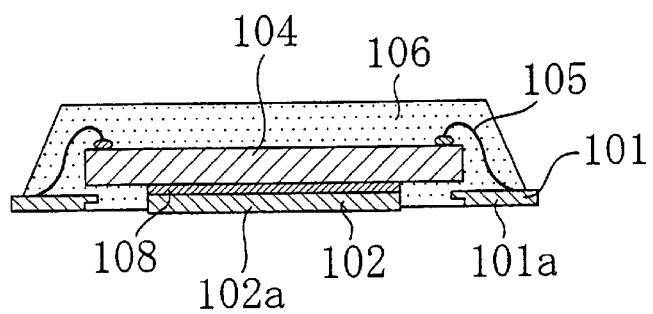
FIG. 18(b) is a cross-sectional view of the power QFN package taken along the line XVIIIb—XVIIIb.
Figure 18C:
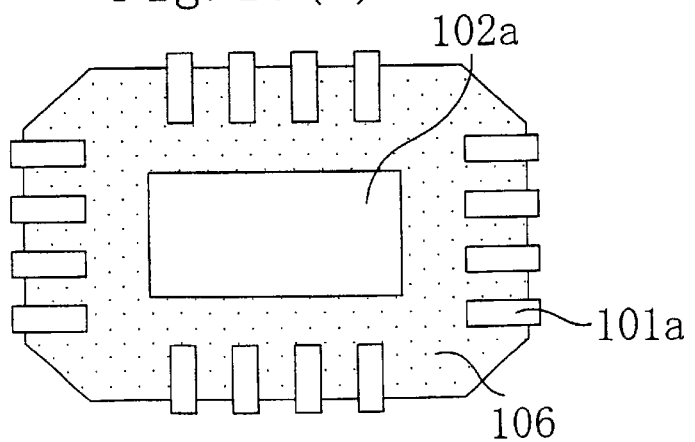
FIG. 18(c) is a bottom view of the power QFN package.

Moreover, the lower surface of the semiconductor chip 4 is not in contact with the entire die pad 2, but with only the central portion 2a thereof, thus increasing the humidity resistance of the package. The reason is as follows. In the conventional structure shown in FIGS. 18(a) through 18(c), if a semiconductor chip 104 of a small size is mounted on the die pad 102, then the semiconductor chip 104 is in contact with the die pad 104 substantially entirely. In such a case, if humidity or water penetrates into the package through a gap between the die pad 102 and the resin encapsulant 106, then the semiconductor chip 104 cannot adhere strongly to the die pad 102 anymore. Or the humidity resistance of the package deteriorates (for example, a crack might be created). In contrast, if the semiconductor chip 4 is in contact with the die pad 2 only at the central portion 2a as in this embodiment, the resin encapsulant 6 exists between the peripheral portion 2b of the die pad 2 and the chip 4 even if the chip 4 is as small as the die pad 2. Accordingly, even a small-sized chip 4 can be strongly held by the resin encapsulant 6 and it is possible to prevent humidity or water from entering the package through the backside. Thus, no cracks are caused in the package.

In the example illustrated in FIG. 1(a), the semiconductor chip 4 is in contact with part of the support lead 3. However, the semiconductor chip 4 and the support lead 3 may or may not be in contact with each other. Also, when part of the die pad 2 is elevated, the upper surface of the central portion 2a may be located above the uppermost surface of the support lead 3. Furthermore, when the die pad 2 is partially elevated, the upper surface of the central portion 2a thereof with no DB paste thereon may be located below the uppermost surface of the support lead 3. In such a case, however, the lower surface of the semiconductor chip 4 mounted on the central portion 2a with the DB paste 7 interposed therebetween should be located above the uppermost surface of the support lead 3. In the embodiment where the semiconductor chip 4 is partially in contact with the support leads 3, the semiconductor chip 4 can be supported more stably.

Also, as shown in FIG. 1(a), even if the semiconductor chip 4 hangs out over the signal leads 1, the semiconductor chip 4 is not hampered by the signal leads 1 in the power QFN package according to this embodiment. Thus, the adhesion of the resin encapsulant 6 to the signal leads 1 may be increased by making the inwardly extending portion of each signal lead 1 sufficiently long.

Method for Manufacturing Power QFN Package

Hereinafter, a method for manufacturing the power QFN package according to the first embodiment will be described with reference to the accompanying drawings. FIGS. 3(a) and 3(b), FIGS. 4(a) and 4(b) and FIGS. 5 through 8 illustrate respective process steps for manufacturing the power QFN package according to the first embodiment.

Figure 3A:
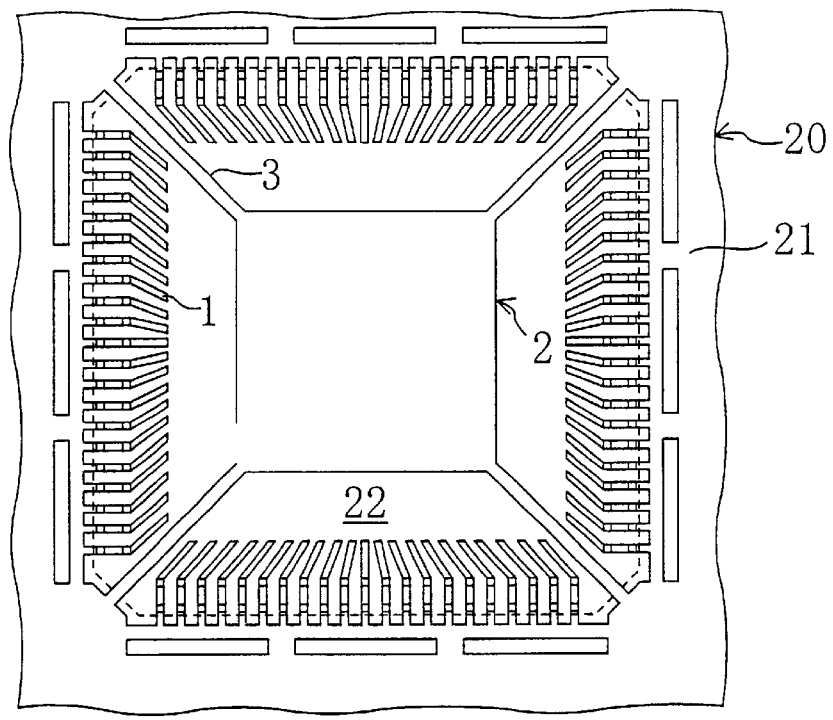
FIGS. 3(a) and 3(b) are plan views illustrating the step of preparing a leadframe during a manufacturing process according to the first embodiment.

First, in the process step shown in FIG. 3(a), a copper alloy plate is etched and patterned, thereby forming a leadframe 20 with a plurality of openings 22 for mounting semiconductor chips therein. In FIG. 3(a), only one opening 22 is illustrated for the sake of simplicity. The leadframe 20 includes: the signal leads 1 extending inward from the outer rail 21; the die pad 2 for supporting a semiconductor chip thereon; and the support leads 3 for connecting the die pad 2 to the outer rail 21 and thereby supporting the die pad 2. This leadframe 20 is not provided with any tie bars for stopping the overflow of the resin encapsulant during resin molding.

Figure 3B:
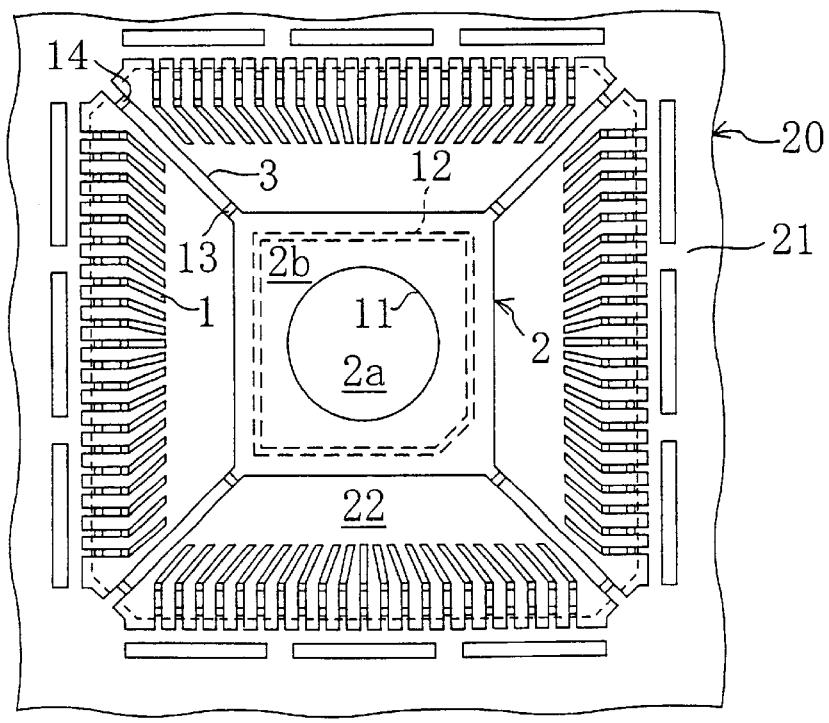

The leadframe 20 may be plated with metal layers of nickel (Ni), palladium (Pd) and gold (Au) either at this point in time or after the process step shown in FIG. 3(b) has been performed.

Figure 4A:
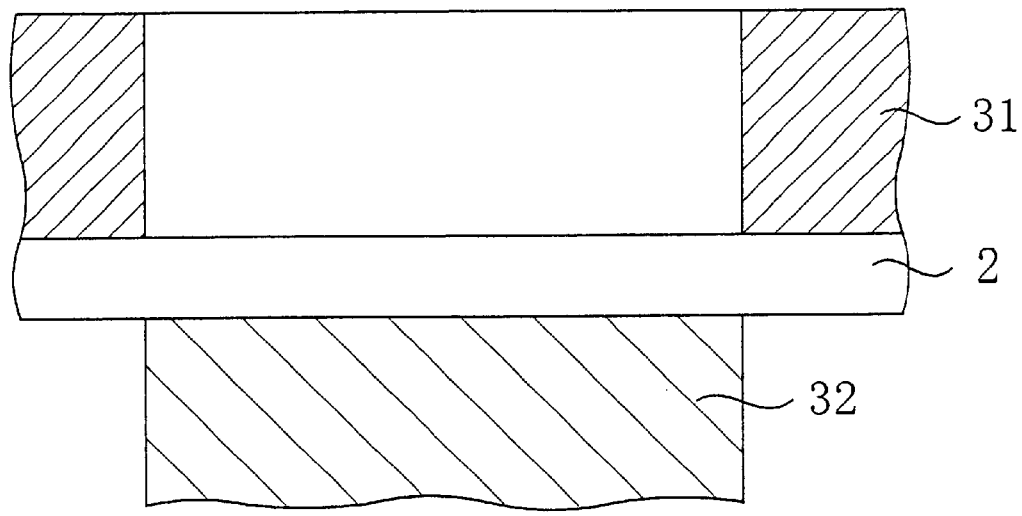
FIGS. 4(a) and 4(b) are cross-sectional views illustrating how the cross section of a leadframe workpiece changes before and after a die pad is half-blanked during the manufacturing process according to the first embodiment.
Figure 4B:
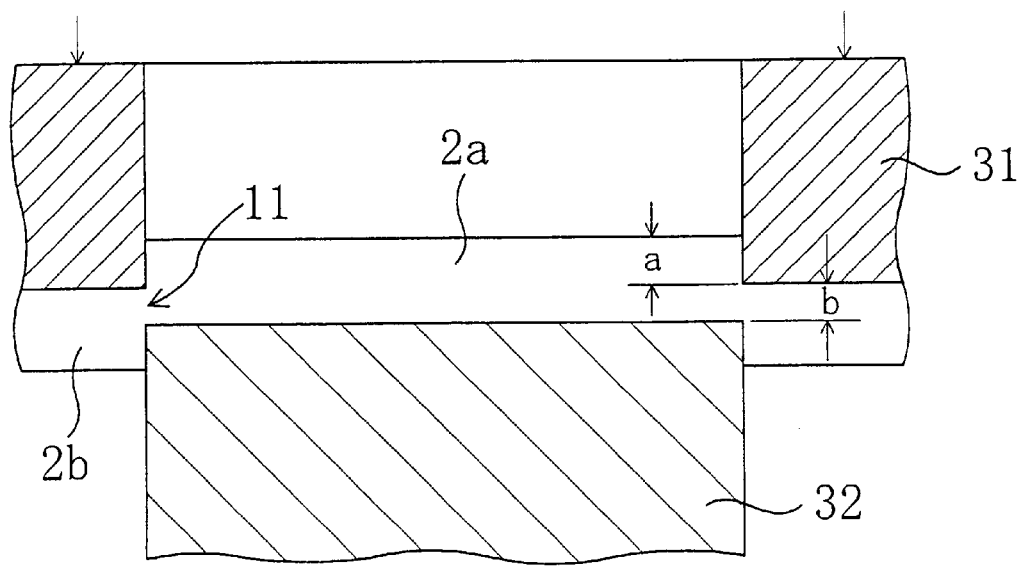

Next, in the process step shown in FIG. 3(b), the die pad 2 of the leadframe 20 is wrought by pressworking to form the half-blanked portion 11 that divides the die pad 2 into the central portion 2a and the peripheral portion 2b. FIGS. 4(a) and 4(b) are cross-sectional views illustrating how the pressworking is performed. First, a blanking press mold, including: a die 31 with a circular opening; and a punch 32 with substantially the same transverse cross section as that of the opening, is prepared. Next, as shown in FIG. 4(a), the die pad 2 of the leadframe 20 is placed on the punch 32 and the die 31 is attached to the upper surface of the die pad 2. Then, as shown in FIG. 4(b), the die 31 is lowered. In this case, the die 31 and the punch 32 are both forced into the die pad 2 from the upper and lower surfaces thereof. The lowest possible level that the die 31 can reach is defined at substantially the same level as the midway point of the die pad 2, where the thickness a of the sheared portion is approximately equal to the thickness b of the non-sheared portion. That is to say, although the blanking press mold is herein used, the central portion 2a of the die pad 2 is not blanked completely but left half-blanked. In this manner, the central portion 2a is elevated above the peripheral portion 2b.

Also, by performing such half-blanking, the central portion 2a of the die pad 2 can be elevated over a wider area than that attained by common bending without causing any strain in respective portions of the die pad 2.

Next, the bent portions 13 and 14 are formed for the support lead 3 and the narrow groove 12 is formed in the lower surface of die pad 2 at the peripheral portion 2b by pressworking either sequentially or simultaneously.

FIGS. 5 through 8 illustrate how the cross section of the structure taken along the line Ia—Ia shown in FIG. 1(b) changes. Also, in these drawings, the respective structures are magnified to a larger scale vertically than horizontally.

Figure 5:
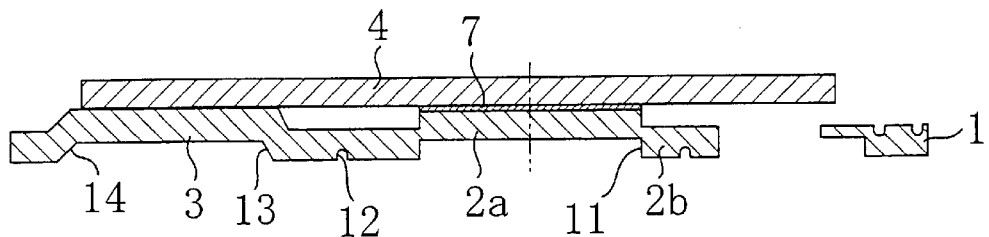
FIG. 5 is a cross-sectional view illustrating the step of bonding a semiconductor chip onto the die pad during the manufacturing process according to the first embodiment.

In the process step shown in FIG. 5, the semiconductor chip 4 is mounted on the central portion 2a of the die pad 2 in the leadframe 20 prepared and bonded thereto with DB paste 7 such as silver paste containing an epoxy resin as a binder. This process step is so-called "die bonding".

Figure 6:
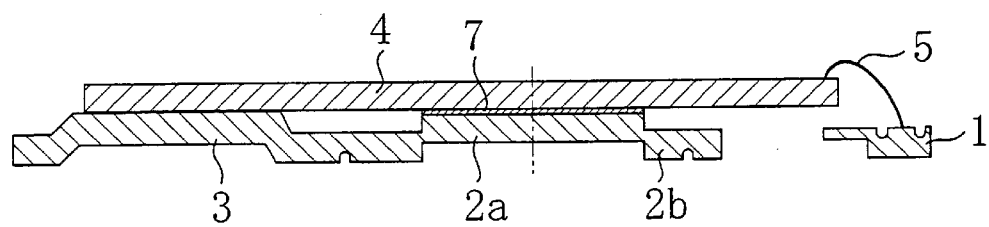
FIG. 6 is a cross-sectional view illustrating the step of forming metal fine wires during the manufacturing process according to the first embodiment.

Then, in the process step shown in FIG. 6, the electrode pads (not shown) of the semiconductor chip 4 are electrically connected to the signal leads 1 with the metal fine wires 5. This process step is so-called "wire bonding". The metal fine wires 5 may be made of an appropriately selected material such as aluminum (Al) or gold (Au). Optionally, the semiconductor chip 4 may be electrically connected to the signal leads 1 via bumps or the like, not the metal fine wires 5.

Figure 7:
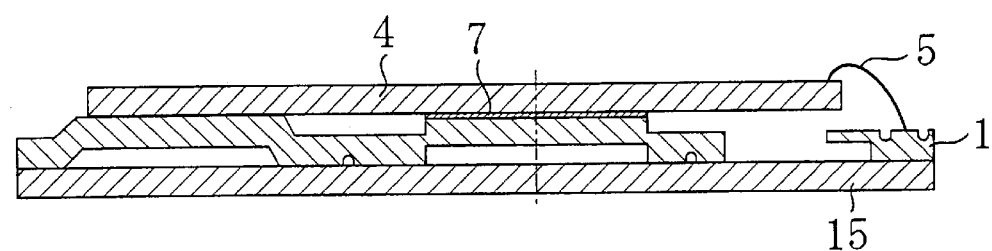
FIG. 7 is a cross-sectional view illustrating the step of interposing a seal tape between the leadframe and a molding die assembly during the manufacturing process according to the first embodiment.

Subsequently, in the process step shown in FIG. 7, a seal tape 15 is interposed between the leadframe 20 and the backside of the signal leads 1 by placing the leadframe 20, to which the semiconductor chip 4 has been bonded and the seal tape 15 has been attached, into a molding die assembly. In this process step, the seal tape 15 is fed from a roll as will be described later. In the illustrated embodiment, the leadframe in the state shown in FIG. 7 is placed upside down into the molding die assembly. Alternatively, the leadframe may be inserted as it is in the state shown in FIG. 7, where no clamping force has been applied thereto yet.

The seal tape 15 is used as a sort of mask for preventing the resin encapsulant from overflowing and reaching the backside of the signal leads 1 during the resin molding process step. The existence of the seal tape 15 can prevent resin burr from being formed on the backside of the signal leads 1. The seal tape 15 may be any resin-based tape, which is mainly composed of polyethylene terephthalate, polyimide, polycarbonate or the like, can be easily peeled off after resin molding and has some resistance to an elevated-temperature environment during the resin molding. In this embodiment, a tape mainly composed of polyethylene terephthalate is used and the thickness thereof is 50 $\mu$m.

In this embodiment, the seal tape 15 is adhered to the respective lower surfaces of the outer rail 21, signal leads 1, support leads 3 (except for the raised portions thereof) and peripheral portion 2b of the die pad 2 in the leadframe 20.

Figure 8:
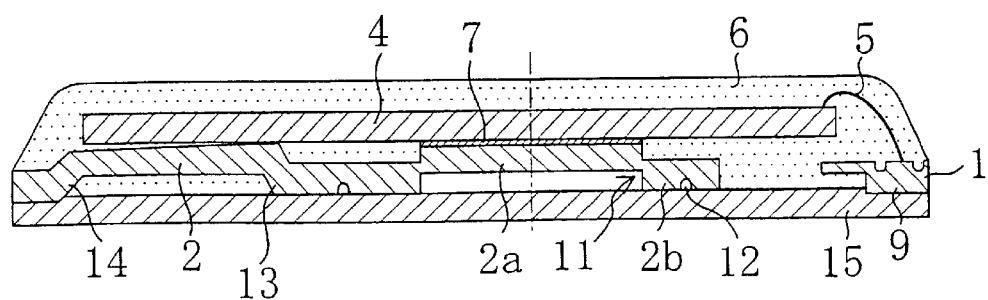
FIG. 8 is a cross-sectional view illustrating a resin molding step during the manufacturing process according to the first embodiment.

Then, in the process step shown in FIG. 8, the resin encapsulant 6 like an epoxy resin is poured into the molding die assembly to mold the chip, frame and so on with the encapsulant 6. In this case, resin molding is performed with the clamping force of the die assembly applied to the outer rail of the leadframe 20 and to the seal tape 15 such that the resin encapsulant 6 does not reach the backside of the signal leads 1. The resin molding is also performed with the seal tape 15 on the backside of the signal leads 1, which are adjacent to the outer rail, pressed against the face of the die. Accordingly, since no clamping force is directly applied to the die pad 2, the die pad 2 is elevated upward and the support leads 3 are sloped to gradually decrease their height outward.

When the seal tape 15, which has been attached to the backside of the signal leads 1, is peeled off and removed, external electrodes 9 have been formed to protrude out of the backside of the resin encapsulant 6. Finally, the ends of the signal leads 1 are cut off to be substantially flush with the side faces of the resin encapsulant 6, thereby completing a power QFN package such as that shown in FIG. 1(a).

According to the manufacturing method of this embodiment, the seal tape 15 is interposed in advance between the backside of the signal leads 1 and the molding die assembly before the resin molding process step is performed. Thus, the resin encapsulant 6 cannot reach, and no resin burr is formed on, the backside of the signal leads 1 functioning as external electrodes. Accordingly, resin burr formed on the signal leads need not be removed therefrom using water jet or the like unlike a conventional method for manufacturing a resin-molded semiconductor device with the backside of signal leads entirely exposed. That is to say, since this troublesome deburring step can be omitted, this process is simple enough to mass-produce a great number of resin-molded semiconductor devices (or power QFN packages). In addition, peeling of metal plated layers of nickel (Ni), palladium (Pd) or gold (Au) off the leadframe, which might happen during the conventional deburring process step using water jet, for example, can be eliminated. For that reason, the leadframe can be plated in advance with these metal layers before the resin molding process step.

In addition, since the external electrodes 9 formed by the manufacturing process of this embodiment protrude out of the lower surface of the resin encapsulant 6, the external electrodes 9 can be used as external terminals as they are, without providing any solder balls as in a conventional process.

It should be noted that a level difference is formed between the backside of the signal leads 1 and that of the resin encapsulant 6 as shown in FIG. 8. This is because the seal tape 15 softens and thermally shrinks owing to the heat applied by the molten resin encapsulant 6 during the resin molding step, and the signal leads 1 are strongly forced into the seal tape 15. Accordingly, in this structure, the backside of the signal leads 1 protrudes out of the backside of the resin encapsulant 6. As a result, a standoff height can be ensured for the external electrodes 9, or the respective lower parts of the signal leads 1. Therefore, these protruding external electrodes 9 can be used as external terminals as they are.

The height of the level difference between the backside of the signal leads 1 and that of the resin encapsulant 6 can be controlled based on the thickness of the seal tape 15 attached before the step of molding. For example, in this embodiment, since the thickness of the seal tape 15 is 50 μm, the height of the level difference, i.e., the protrusion height of the external electrodes 9, is usually about one-half of the thickness and 50 μm at its maximum. That is to say, the height of the upwardly forced portion of the seal tape 15 as measured from the backside of the signal leads 1 is determined depending on the thickness of the seal tape 15 itself. In other words, the protrusion height of the external electrodes 9 can be self-controlled by the thickness of the seal tape 15, thus facilitating the manufacturing process. The protrusion height of the external electrodes 9 can be controlled only by monitoring the thickness of the seal tape 15 during a mass production process, and there is no need to provide an additional process step for that purpose. Accordingly, the manufacturing method of this embodiment is extremely advantageous in terms of the process control cost. It should be noted that as for the seal tape 15 to be interposed, the hardness of a material used, the thickness and the thermal softening properties thereof can be determined depending on the desired height of the level difference.

Furthermore, since the narrow groove 12 is provided in the lower surface of the die pad 2 at the peripheral portion 2b, the peripheral portion 2b of the die pad 2 is pressed downward due to the pressure applied when the molten resin encapsulant 6 is injected during resin molding. And the seal tape 15 is engaged with the periphery of the narrow groove 12. As a result, the overflow of the resin encapsulant 6 can be prevented more effectively.

Details of Resin Molding Step

Next, the resin molding process step according to the first embodiment will be described in further detail.

Figure 9A:
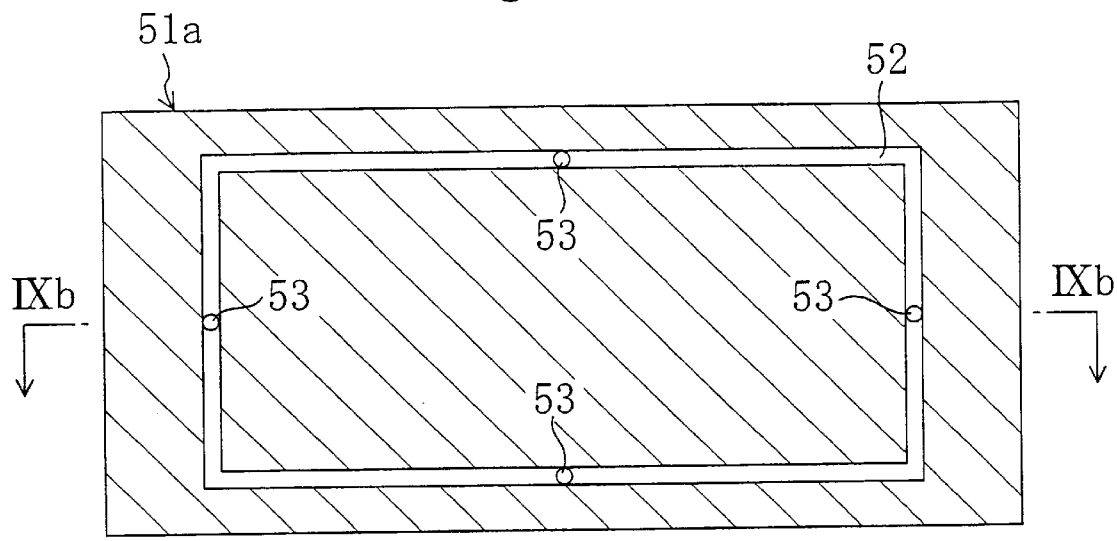
FIG. 9(a) is a plan view of a lower die used according to the first embodiment.
Figure 9B:
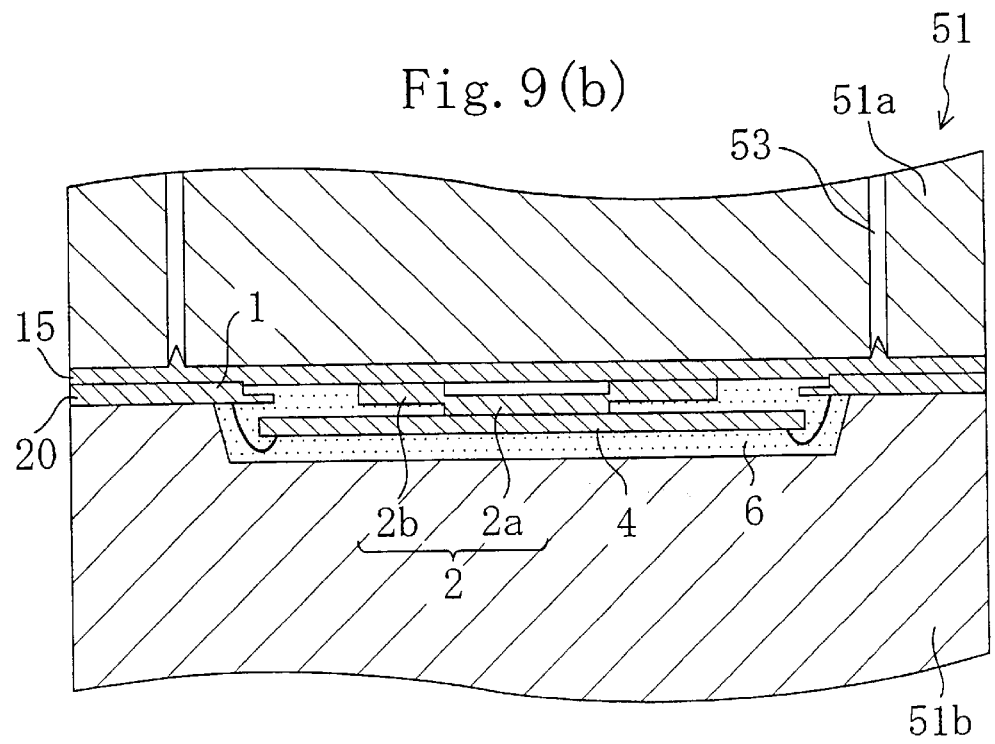
FIG. 9(b) is a cross-sectional view illustrating how resin molding is carried out.
Figure 10A:
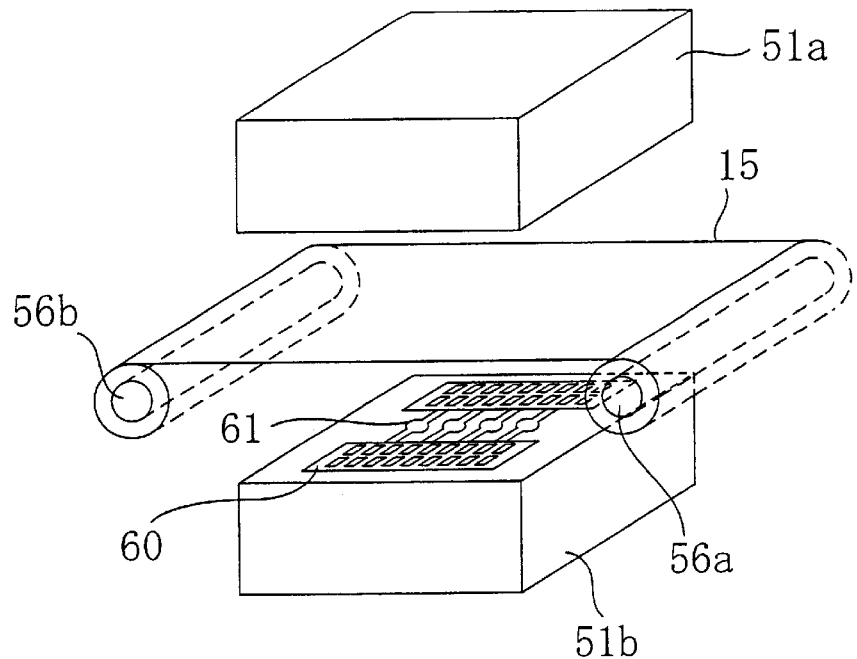
FIGS. 10(a), 10(b) and 10(c) are perspective views illustrating a resin molding assembly with a seal tape feeder and how to carry out resin molding according to the first embodiment.
Figure 10B:
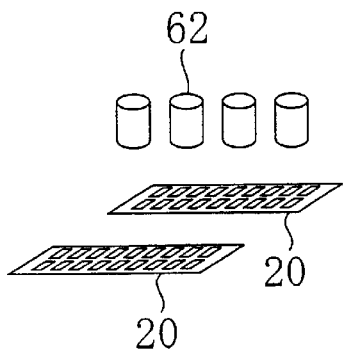
Figure 10C:
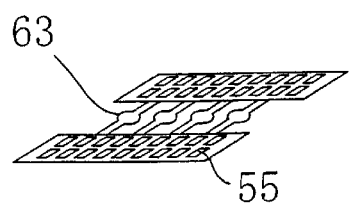

FIG. 9(a) is a plan view of an (upper) molding die used in this embodiment, while FIG. 9(b) is a cross-sectional view taken along the line IXb—IXb in FIG. 9(a) illustrating how resin molding is carried out using the molding die assembly. FIGS. 10(a), 10(b) and 10(c) are perspective views illustrating a resin molding assembly with a seal tape feeder and how to carry out resin molding according to the first embodiment. FIG. 11 is a cross-sectional view illustrating a state of the molding die assembly during resin molding.

As shown in FIGS. 9(a) and 9(b), the molding die assembly 51 used in this embodiment consists of upper and lower dies 51a and 51b. The upper die 51a is provided with four vacuum suction holes 53 and a vacuum suction groove 52 linking these holes 53 together. As shown in FIG. 10(a), the lower die 51b of the molding die assembly 51 is provided with a pair of semiconductor component molding sections 60. Each of these sections 60 includes the same number of die cavities as that of the semiconductor chips 4 mounted on the leadframe 20. The lower die 51b is further provided with resin encapsulant flow paths 61 for supplying the resin encapsulant to these semiconductor component molding sections 60.

FIGS. 9(a) and 9(b) illustrate structure and setting corresponding to just one die cavity for the illustrative purposes. It should be noted that the same structure and setting are applicable to the other die cavities. First, it will be described with reference to FIG. 9(b) how resin molding is carried out within a single die cavity.

First, the leadframe 20 is placed on the lower die 51b in such a manner as to put the respective semiconductor chips 4 within the associated die cavities of the lower die 51b. In this case, the lower surface of the upper die 51a comes into contact with the upper surface of the seal tape 15. The seal tape 15 and leadframe 20 are pressed against the lower die 51b by the upper die 51a. The seal tape 15 gets closely stuck to the upper die 51a at four positions and is kept uniformly stretched by a vacuum pump (not shown) through the four vacuum suction holes 53 formed in the upper die 51a. If the resin molding process step is performed in such a state, then no wrinkles are formed on the seal tape 15 due to thermal shrinkage during resin molding. As a result, in the resin-molded semiconductor device, the backside of the resin encapsulant can be flattened.

Specifically, wrinkles can be eliminated from the seal tape by the following mechanism. During resin molding, the seal tape 15 is going to thermally shrink because of the heat applied. If the seal tape 15 is vacuum-sucked through the vacuum suction holes 53, however, the seal tape 15 is stretched toward the respective vacuum suction holes 53 against this shrinkage action. As can be seen, by keeping the seal tape 15 tense in this manner, the shrinkage of the seal tape 15 can be suppressed and no wrinkles are formed thereon. As a result, it is possible to flatten the surface of the resin encapsulant 6 in contact with the seal tape 15 on the backside of the resin-molded semiconductor device formed in this way.

The depth and width of the vacuum suction groove 52 linking the vacuum suction holes 53 of the upper die 51a together should preferably be defined in view of the thermal expansion coefficient of the seal tape 15.

It is noted, however, that wrinkles can still be eliminated from the seal tape even if the seal tape is stretched independently through the vacuum suction holes without providing the vacuum suction groove.

Also, the number and shape of the vacuum suction groove 52 are not limited to those illustrated in FIG. 9(a). For example, a plurality of such vacuum suction grooves may be provided.

Moreover, in the structure shown in FIG. 9(b), engraved portions may also be provided within the upper surface of the upper die 51a at respective regions over the signal leads 1 such that parts of the seal tape 15 can be forced into those engraved portions during resin molding. In general, deep grooves are likely to be formed in respective regions of the resin encapsulant between the signal leads 1. If these engraved portions are formed, however, the depth of such grooves can be reduced.

Furthermore, the wrinkles can be eliminated from the seal tape 15 not only by using the vacuum suction groove but also by providing mutually engaging concave and convex portions for the upper and lower dies, respectively. In the latter embodiment, when clamping force is applied to the upper and lower dies, the concave and convex portions engage each other to tense the seal tape. Moreover, a clamper may also be provided for the molding die assembly to apply tension to the seal tape.

Next, it will be described with reference to FIGS. 10(a), 10(b) and 11 how to feed the seal tape 15 and the total resin molding procedure.

As shown in FIG. 10(a), the resin molding assembly according to this embodiment includes a seal tape feeder, which can continuously unwinds and winds the seal tape 15 with constant tension applied to the tape 15 between an unwind roll 56a and a wind roll 56b.

And as shown in FIG. 10(b), when the leadframe 20 mounting a large number of semiconductor chips thereon is placed on the lower die 51b, resin tablets 62 are introduced into resin supply sections of the lower die 51b.

Next, as shown in FIG. 11, the upper and lower dies 51a and 51b of the molding die assembly 51 are fastened tight together and a molten resin encapsulant is forced upward by pistons 58 and supplied into the respective semiconductor component molding sections 60. As a result, resin-molded semiconductor devices (power QFN packages) 55 are injection-molded in the respective die cavities. When the injection molding process is over, the lower die 51b is opened.

In this case, when the lower die 51b is opened, the seal tape 15 is removed from resin culls 63 and the resin-molded semiconductor devices 55 shown in FIG. 10(c). Part of the seal tape 15 that has been used during the last resin molding process step is wound around the wind roll 56b and another part of the tape 15 that will be used during the next resin molding step is unwound from the unwind roll 56a. In the meantime, the resin culls 63 and resin-molded semiconductor devices 55 are taken out of the lower die 51b.

According to this embodiment, since the seal tape 15 can be continuously fed between the unwind and wind rolls 56a and 56b, the resin molding process step using the seal tape 15 can be performed quickly, thus increasing the productivity. Also, since appropriate tension may also be applied to the seal tape 15 if rotational force is applied to the unwind and wind rolls 56a and 56b, wrinkles can be eliminated from the seal tape 15 even more effectively during the resin molding process step.

In the foregoing embodiment, the seal tape 15 is fed into the molding die assembly and adhered to the leadframe 20 after the leadframe 20 has been placed in the die assembly. Alternatively, the seal tape 15 may be attached to the respective lower surfaces of the signal leads 1 of the leadframe in advance before the resin molding process step, instead of such a roll feeding technique.

Embodiment 2

Hereinafter, a second exemplary embodiment of the present invention will be described. In the structure according to the first embodiment in which the central portion (chip supporting portion) of the die pad 2 is elevated, no resin encapsulant 6 exists under the central portion 2a, which is just a concave portion as shown in FIG. 2. In contrast, according to the second embodiment, the region under the central portion (chip supporting portion) of the die pad is also filled in with the resin encapsulant.

Figure 12A:
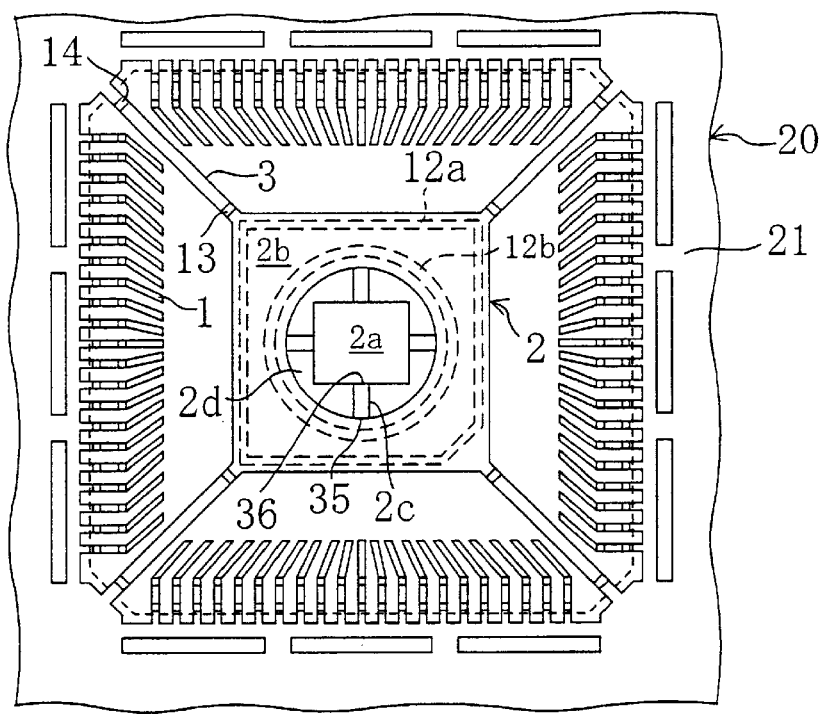
FIG. 12(a) is a plan view of a leadframe for a power QFN package according to a second embodiment of the present invention.
Figure 12B:
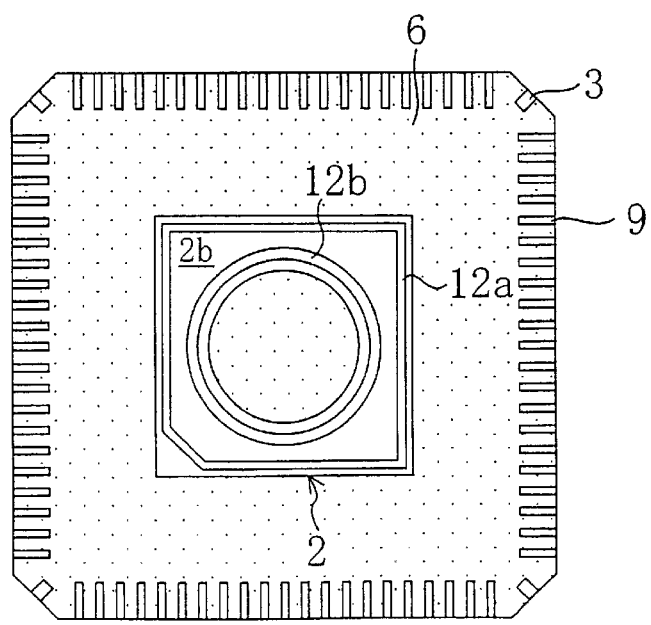
FIG. 12(b) is a bottom view of the power QFN package molded with a resin.

FIGS. 12(a) and 12(b) are a plan view of a leadframe for a power QFN package according to a second embodiment and a bottom view of the power QFN package molded with a resin, respectively.

As shown in FIG. 12(a), the die pad 2 except for the peripheral portion 2b is divided into: an elevated square central portion 2a; four linkage portions 2c linking the central portion 2a and the peripheral portion 2b together; and punched portions 2d. Each of the linkage portions 2c is provided with two bent portions 35 and 36, thereby elevating the central portion 2a above the peripheral portion 2b.

Alternatively, the central portion 2a may be elevated by half-blanking the linkage portions 2c around a particular circle as in the first embodiment.

In the first embodiment, only one narrow groove 12 is formed in the lower surface of the die pad 2 at the peripheral portion 2b. In contrast, according to the second embodiment, closed-loop narrow grooves 12a and 12b are formed in the lower surface of the die pad 2 at the peripheral portion 2b. These grooves are provided because the resin encapsulant might overflow from the inner periphery of the peripheral portion 2b of the die pad 2 as well as from the outer periphery thereof.

The description of the manufacturing process according to the second embodiment will be omitted herein. This is because the manufacturing process of the first embodiment is applicable almost as it is on the whole. That is to say, not only die bonding for mounting the semiconductor chip on the die pad and wire bonding for connecting the metal fine wires, but also resin molding are performed in similar manners. Specifically, the seal tape is interposed between the leadframe and the molding die assembly and fed using the rolls to eliminate wrinkles from the tape in the same way.

As shown in FIG. 12(b), on the backside of a power QFN package formed by performing resin molding with the seal tape interposed between the lower surface of the peripheral portion 2b and the molding die assembly using the leadframe of the second embodiment, the resin encapsulant 6 reaches the region under the central portion 2a of the die pad 2, too.

The power QFN package according to the second embodiment is provided with such punched portions 2d. Thus, during the resin molding process step, the resin encapsulant 6 flows from the periphery of the die pad 2 through the punched portions 2d into the region under the central portion 2a. That is to say, since the region under the central portion 2a of the die pad 2 can also be filled in with the resin encapsulant 6, the resin encapsulant 6 can adhere to the die pad 2 more closely. As a result, the reliability of the power QFN package including the humidity resistance thereof can be improved.

Embodiment 3

Figure 13A:
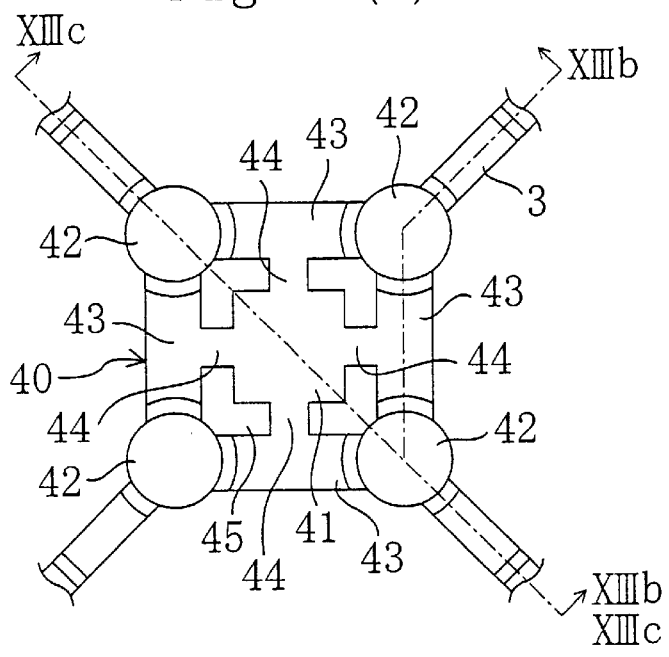
FIG. 13(a) is a plan view of a lead frame for a power QFN package according to a third embodiment of the present invention.
Figure 13B:
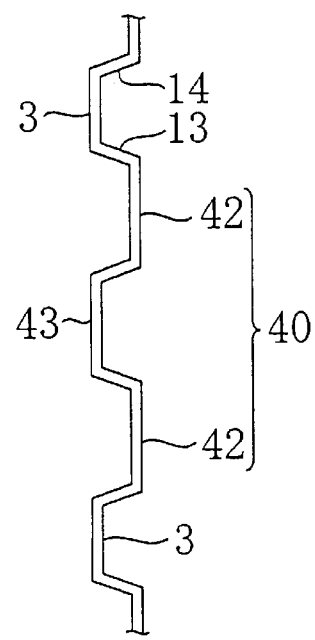
FIGS. 13(b) and 13(c) are cross-sectional views of the leadframe taken along the lines XIIIb—XIIIb and XIIIc—XIIIc, respectively.
Figure 13C:
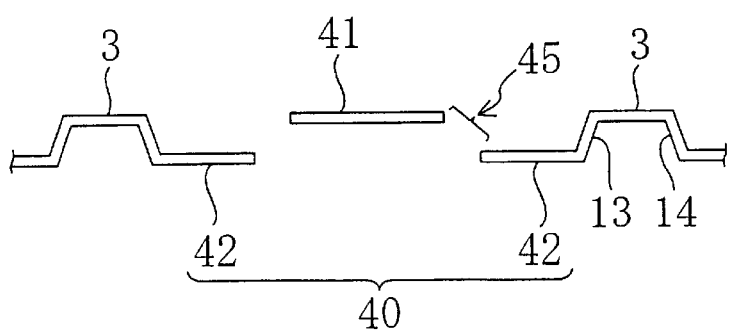
Figure 14:
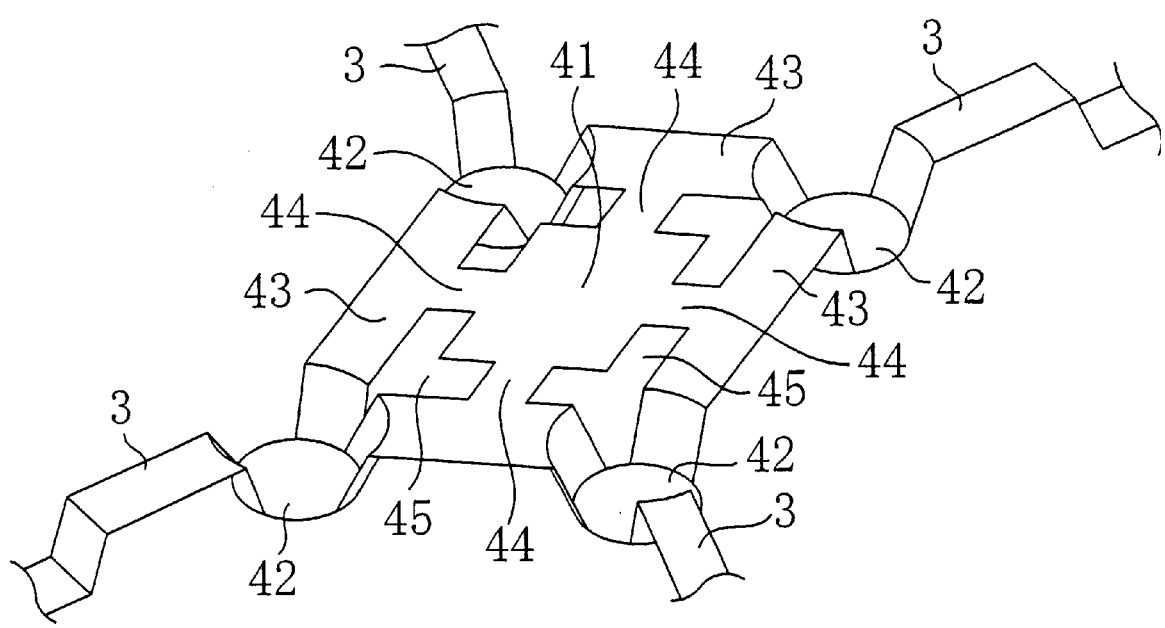
FIG. 14 is a perspective view of the leadframe according to the third embodiment.

Hereinafter, a resin-molded semiconductor device (or power QFN package) according to a third exemplary embodiment of the present invention will be described. FIG. 13(a) is a plan view of a leadframe used for the power QFN package according to the third embodiment, while FIGS. 13(b) and 13(c) are cross-sectional views of the leadframe taken along the lines XIIIb—XIIIb and XIIIc—XIIIc, respectively. FIG. 14 is a perspective view of the leadframe according to the third embodiment. In FIG. 14, the leadframe is illustrated as having substantially no thickness. It is noted that the thickness of the leadframe may be defined at any value those skilled in the art would find appropriate.

As shown in FIGS. 13(a) through 13(c) and 14, a die pad 40 according to the third embodiment is divided into: a square central portion (chip supporting portion) 41; circular corner portions 42 provided at four corners; four sides 43 directly linked to the corner portions 42; four linkage portions 44 linking the central portion 41 and the respective sides 43 together; and four punched portions 45. The central portion 41, sides 43 and linkage portions 44 are elevated above the corner portions 42. Just the leadframe structure according to the first embodiment, each support lead 3 has such a cross section as being raised midway by two bent portions 13 and 14.

The description of the manufacturing process according to the third embodiment will be omitted herein. This is because the manufacturing process of the first embodiment is applicable almost as it is on the whole. That is to say, not only die bonding for mounting the semiconductor chip on the die pad and wire bonding for connecting the metal fine wires, but also resin molding are performed in similar manners. specifically, the seal tape is interposed between the leadframe and the molding die assembly and fed using the rolls to eliminate wrinkles from the tape in the same way.

According to the third embodiment, the corner portions 42 come into contact with the seal tape in relatively small areas. Thus, it is possible to prevent the resin encapsulant from reaching the respective lower surfaces of the corner portions 42 without providing the narrow grooves as is done in the first or second embodiment.

Figure 15:
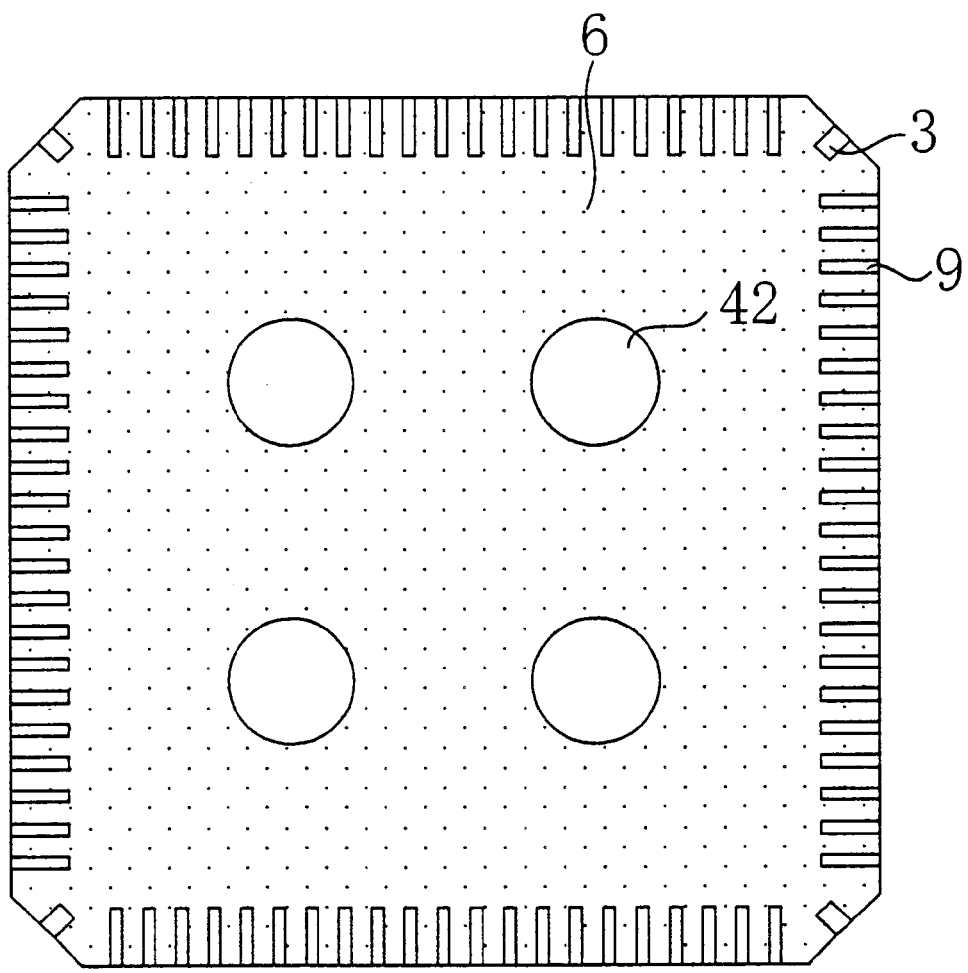
FIG. 15 is a bottom view of a power QFN package formed by using the leadframe according to the third embodiment.

FIG. 15 is a bottom view of a power QFN package formed by using the leadframe according to the third embodiment and performing resin molding with the seal tape interposed between the lower surfaces of the corner portions 42 and the molding die assembly. As shown in FIG. 15, only the external electrodes 9, outer peripheral ends of the support leads 3 and corner portions 42 of the die pad 40 are not covered with the resin encapsulant 6 but exposed. That is to say, the region under the central portion 41 of the die pad 40 is also filled in with the resin encapsulant 6. Also, in the die bonding process step of mounting a semiconductor chip on the die pad during the manufacturing process of a power QFN package according to the third embodiment, the semiconductor chip is supported only by the central portion 41 of the die pad. This is because the expansion of the DB paste can be prevented by providing the punched portions 45. And the semiconductor chip is strongly held by the resin encapsulant existing under the punched portions 45. As can be seen, since the die pad 40 is in contact with the semiconductor chip in a small area, it is possible to prevent the humidity resistance of the resin-molded semiconductor device from deteriorating.

In the power QFN package according to the third embodiment, by partially punching the die pad 40 to provide the punched portions 45, the resin encapsulant 6 passes through the punched portions 45 and flows into the region under the central portion 41 (chip supporting portion) during resin molding. Thus, the region under the central portion 41 can be filled in with the resin encapsulant. As a result, similar effects to those of the second embodiment can also be attained.

Embodiment 4

Figure 16:
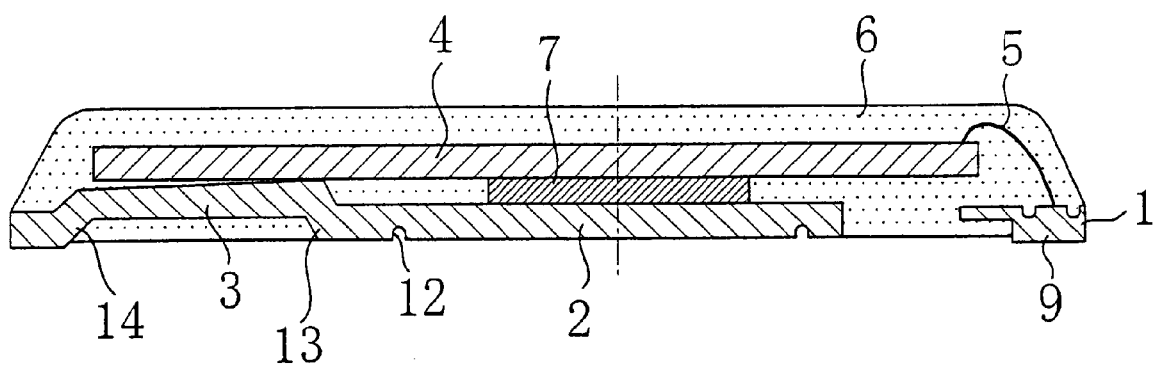
FIG. 16 is a cross-sectional view of a power QFN package according to a fourth embodiment of the present invention.

Hereinafter, a resin-molded semiconductor device (or power QFN package) according to a fourth exemplary embodiment of the present invention will be described. FIG. 16 is a cross-sectional view of a power QFN package according to the fourth embodiment, which is also taken along the line Ia—Ia shown in FIG. 1(b).

In a leadframe used for the power QFN package according to the fourth embodiment, no half-blanked portion is formed in the die pad 2 thereof. Thus, the entire die pad 2 is flattened and includes no elevated portion. The support lead 3 is also provided with two bent portions 13 and 14 and the intermediate portion of the support lead 3 is raised, i.e., located at a higher level than both end portions. The semiconductor chip 4 is supported by the support leads 3 at the raised portions thereof. The DB paste 7 interposed between the semiconductor chip 4 and the die pad 2 is thickened to bond them together. In the other respects, the structure of the power QFN package according to the fourth embodiment is the same as that of the power QFN package according to the first embodiment.

The description of the manufacturing process according to the fourth embodiment will be omitted herein. This is because the manufacturing process of the first embodiment is applicable almost as it is on the whole. That is to say, not only die bonding for mounting the semiconductor chip on the die pad and wire bonding for connecting the metal fine wires, but also resin molding are performed. in similar manners. Specifically, the seal tape is interposed between the leadframe and the molding die assembly and fed using the rolls to eliminate wrinkles from the tape in the same way.

In the power QFN package according to the fourth embodiment, the weight of the semiconductor chip 4 is not applied to the DB paste 7 during die bonding. Thus, the DB paste 7 hardly expands on the die pad 2 due to the surface tension of the DB paste 7. Accordingly, the contact area between the semiconductor chip 4 and the die pad 2 can be minimized with the DB paste 7 interposed therebetween. As a result, the power QFN package can maintain good humidity resistance through the functions described above. Also, the semiconductor chip 4 can be supported by the support leads 3 more stably.

Embodiment 5

Figure 17A:
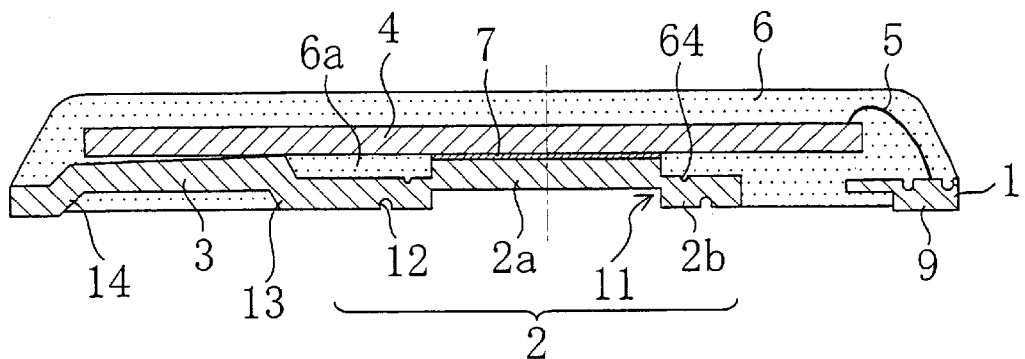
FIG. 17(a) is a cross-sectional view of a power QFN package according to a fifth embodiment of the present invention taken along the line XVIIa—XVIIa.
Figure 17B:
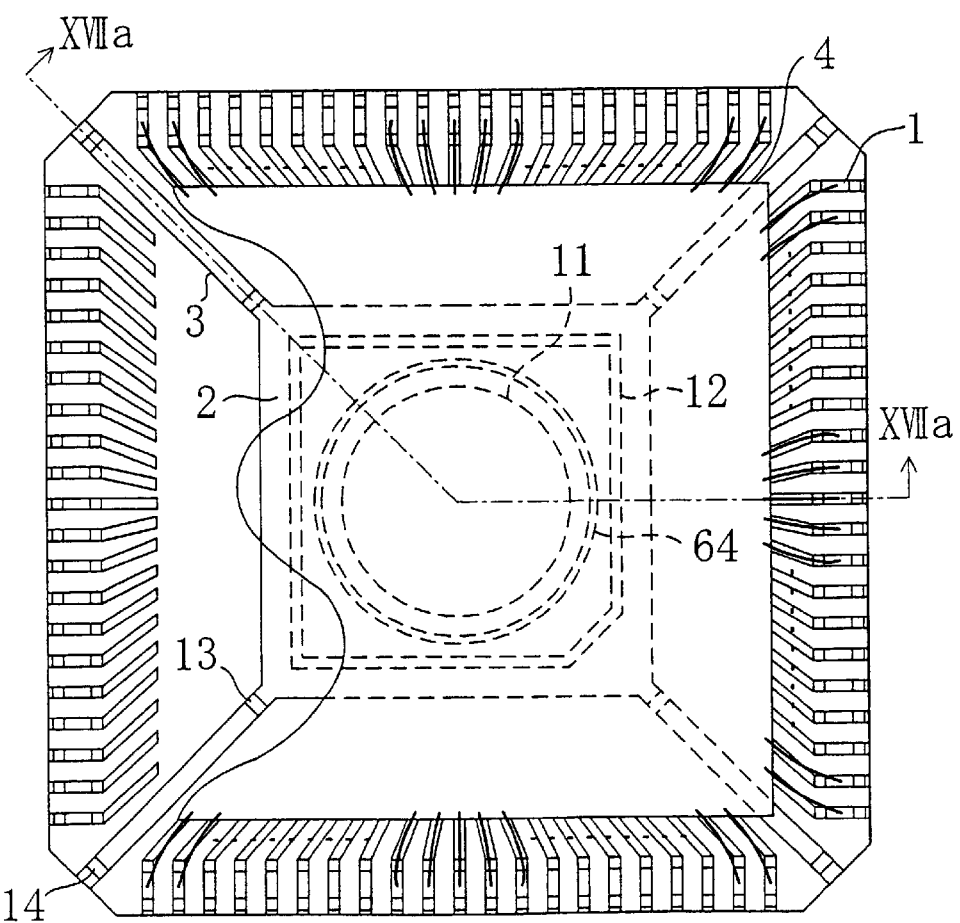
FIG. 17(b) is a plan view of the power QFN package.

Hereinafter, a resin-molded semiconductor device (or power QFN package) according to a fifth exemplary embodiment of the present invention will be described. FIG. 17(a) is a cross-sectional view of a power QFN package according to the fifth embodiment taken along the line XVIIa—XVIIa in FIG. 17(b), while FIG. 17(b) is a plan view thereof. FIG. 17(a) illustrates the resin encapsulant partially opened to show the internal structure thereof clearly. It should be noted that the cross section illustrated in FIG. 17(a) is magnified to a larger scale vertically than horizontally to make the structure easily understandable. Also, in FIG. 17(b), the resin encapsulant 6 is illustrated as being transparent to make the structure see-through.

A resin-molded semiconductor device according to the fifth embodiment is also formed by using a leadframe. The leadframe includes: an outer rail surrounding an opening, in which a semiconductor chip will be mounted; a die pad 2 provided inside the opening for supporting a semiconductor chip 4 thereon; a plurality of support leads 3 for supporting the die pad 2; and a plurality of signal leads 1. One end of each of these signal leads 1 is connected to the outer rail, while the other end extends toward the die pad 2. Each of the support leads 3 is provided with raised portions 13 and 14 higher in level than the other portion thereof. The central portion 2a of the die pad 2 is elevated above the peripheral portion 2b via a half-blanked portion 11, and is used as a support to be bonded to the backside of the semiconductor chip 4 mounted thereon. A circular groove 64 with an approximately half circular cross section, a depth of about 80 μm and a width of about 120 μm is provided in the peripheral portion 2b of the die pad 2 surrounding the central portion 2a.

The resin-molded semiconductor device according to the fifth embodiment includes the signal leads 1, die pad 2, support leads 3, semiconductor chip 4 mounted on the central portion 2a of the die pad 2 and metal fine wires 5 for electrically connecting electrodes (not shown) of the semiconductor chip 4 to the signal leads 1. The semiconductor chip 4, die pad 2, support leads 3, metal fine wires 5 and signal leads 1 are molded with a resin encapsulant 6. The lower and outer peripheral sides of each signal lead 1 are exposed as an external terminal and the lower part of the lead 1 is protruded downward. In this embodiment, the gap between the upper surface of the die pad 2 at the peripheral portion 2b and the backside of the semiconductor chip 4 is filled in with the resin encapsulant 6 to form a gap-filling portion 6a. Also, the groove 64 is formed in the upper surface of the peripheral portion 2b so as to surround the central portion 2a functioning as a support elevated via the half-blanked portion 11.

As shown in FIGS. 17(a) and 17(b), the resin-molded semiconductor device according to the fifth embodiment has almost the same structure as the counterpart shown in FIG. 1. The device according to the fifth embodiment is characterized by providing the groove 64 in the upper surface of the die pad 2 at the peripheral portion 2b surrounding the central portion 2a.

That is to say, the resin-molded semiconductor device according to the fifth embodiment includes all the components of the resin-molded semiconductor device according to the first embodiment shown in FIG. 1. Thus, as a matter of principle, the same effects as attained by the first embodiment are also attainable.

In addition, since the groove 64 is formed in the upper surface of the die pad 2 at the peripheral portion 2b, the resin-molded semiconductor device according to the fifth embodiment can also attain the following remarkable effects with respect to reliability.

Specifically, the gap-filling portion 6a of the resin encapsulant 6 exists between the upper surface of the die pad 2 at the peripheral portion 2b surrounding the central portion 2a thereof and the backside of the semiconductor chip 4. The gap-filling portion 6a closely adheres to the peripheral portion 2b. However, if the humidity resistance of the package has deteriorated or thermal stress has been caused for some reason or another, then the gap-filling portion 6a might peel off the die pad 2. And the gap-filling portion 6a might possibly be peeling off the die pad 2 over an increasingly wide area. Even in such a situation where the gap-filling portion 6a is going to peel off the peripheral portion 2b of the die pad 2 over a wider and wider area, that peeled portion can be trapped at the groove 64 provided in the upper surface of the peripheral portion 2b according to this embodiment. Thus, it is possible to prevent the peeled region from expanding beyond the groove 64. That is to say, since the groove 64 can stop the progress of peeling of the gap-filling portion 6a off the die pad 2, the reliability of the resin-molded semiconductor device can be maintained high. The groove 64 is particularly advantageous to the structure shown in FIGS. 17(a) and 17(b), in which the backside of the die pad 2 is exposed at the peripheral portion 2b and the gap-filling portion 6a exists between the semiconductor chip 4 and the die pad 2.

In the illustrated embodiment, just one groove 64 is formed. The effect will be enhanced if two or more grooves are formed in the upper surface of the peripheral portion 2b.

The groove 64 does not have to be the illustrated circular one with a semi-circular cross section. Alternatively, the groove 64 may be a circular one with a non-circular cross section, a partially circular one or a circular one with a similar planar shape to that of the central portion 2a (or 20 the half-blanked portion 11) of the die pad 2. A groove of any of these shapes can advantageously stop the progress of peeling of the resin encapsulant 6 off the die pad 2.

The depth of the groove 64 is preferably in the range from 50 μm to 150 μm. In practice, if the groove 64 is formed by etching or pressworking to a target depth of 100 μm, then the depth of the groove 64 can fall within this range. On the other hand, the width of the groove 64 is also preferably in the range from 50 μm to 150 μm. In practice, if the groove 64 is formed by etching or pressworking to a target width of 100 μm, then the width of the groove 64 can fall within this range. We confirmed empirically that so long as the depth and width of the groove 64 fall within this range, the reliability of the resin-molded semiconductor device can be maintained even if the gap-filling portion 6a is going to peel off the upper surface of the die pad 2 at the peripheral portion 2b over a wider and wider area. This is because the progress of peeling can be stopped by trapping the peeled portion at the groove 64.

In addition, by providing the groove 64 for the peripheral portion 2b of the die pad 2, the gap-filling portion 6a can adhere even more closely to the die pad 2. Accordingly, the existence of the groove 64 can prevent the resin encapsulant 6 from being peeled. off the die pad 2 with a lot more certainty, thus further improving the reliability.

The central portion (supporting portion) 2a of a circular planar shape may also be elevated via the half-blanked portion 11 that has been formed by half-blanking the die pad 2 through pressworking as in the first embodiment.

The manufacturing process of the resin-molded semiconductor device, the leadframe used and the manufacturing process thereof according to the fifth embodiment are different from the counterparts of the first embodiment only in respect of the groove 64 and the process step of making the same.

In particular, if the groove 64 is formed by pressworking, then the groove 64 may be formed simultaneously with the narrow groove 12 in the lower surface of the die pad 2 at the peripheral portion 2b. For example, pressworking for forming the bent portions 13 and 14 of the support leads 3 and pressworking for forming the grooves 12 and 64 in the lower and upper surfaces of the die pad 2 at the peripheral portion 2b may be performed either in this order or at the same time.

In the foregoing embodiments, the center of the die pad 2 does not have to be aligned with the center of the central portion 2a. That is to say, the central portion 2a has only to be located around the center of the die pad.

Other Embodiments

In the foregoing description, the present invention has been described as being applied to a resin-molded semiconductor device for housing a semiconductor chip 4 with a built-in power electronic device (i.e., a power QFN package). The foregoing embodiments of the present invention are naturally applicable to any other resin-molded semiconductor device, in which a semiconductor chip including a device generating a smaller quantity of heat is housed.

What is claimed is:

1. A method for manufacturing a resin-molded semiconductor device, comprising the steps of:
    a) preparing a semiconductor chip;
    b) preparing a leadframe, the leadframe including:
        an outer rail surrounding an opening, in which the semiconductor chip will be mounted;
        a die pad provided inside the opening, a central portion of the die pad being elevated above a peripheral portion thereof surrounding the central portion;
        a plurality of support leads for connecting the die pad to the outer rail, each said support lead including a raised intermediate portion higher in level than the other portion thereof; and
        a plurality of signal leads, which are connected to the outer rail around the periphery of the opening and extend toward the die pad;
    c) bonding the semiconductor chip on the central portion of the die pad in the leadframe;
    d) electrically connecting the semiconductor chip to the signal leads via connection members; and
    e) molding the semiconductor chip, the die pad, the connection members, the support leads and the signal leads with a resin encapsulant with a seal tape interposed between the backside of the leadframe and a die assembly and with clamping force applied to the leadframe and the seal tape.

2. The method of claim 1, wherein in the step 3), the clamping force is applied to the outer rail of the leadframe and to the seal tape.

3. The method of claim 1, wherein in the step b), a closed-loop groove is formed in the lower surface of the die pad at the peripheral portion.

4. The method of claim 1, wherein in the step b), the die pad is partially punched between the central and peripheral portions thereof.

5. A method for manufacturing a resin-molded semiconductor device, comprising the steps of:
    a) preparing a semiconductor chip with electrodes;
    b) preparing a leadframe, the leadframe including:
        an outer rail surrounding an opening, in which the semiconductor chip will be mounted;
        a die pad provided inside the opening, a central portion of the die pad being elevated above a peripheral portion thereof surrounding the central portion, a groove being provided in the upper surface of the die pad at the peripheral portion;
        a plurality of support leads for supporting the die pad; and
        a plurality of signal leads, one end of each said signal lead being connected to the outer rail, while the other end thereof extending toward the die pad;
    c) securing the semiconductor chip onto the die pad by bonding the upper surface of the die pad at the central portion to the backside of the semiconductor chip via an adhesive;
    d) electrically connecting the electrodes of the semiconductor chip mounted on the die pad to the signal leads of the leadframe with metal fine wires;
    e) molding the semiconductor chip, the die pad, the support leads, the metal fine wires and the signal leads with a resin encapsulant with that the lower and outer side faces of each said signal lead are exposed as an external terminal and that a lower part of the signal lead protrudes downward; and
    f) partially cutting the signal leads off such that an end face of each said signal lead is substantially flush with an associated side face of the resin encapsulant, and cutting the support leads off to remove the resin-molded semiconductor device from the outer rail of the leadframe.

6. The method of claim 5, wherein in the step b), the central portion is elevated above the peripheral portion by pressworking and half-blanking the die pad.

* * * * *